(12) United States Patent
Lee et al.

(10) Patent No.: US 11,901,336 B2
(45) Date of Patent: Feb. 13, 2024

(54) SEMICONDUCTOR PACKAGE

(71) Applicant: Samsung Electronics Co., Ltd., Suwon-si (KR)

(72) Inventors: Hyuekjae Lee, Hwaseong-si (KR); Dae-woo Kim, Seongnam-si (KR); Eunseok Song, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 129 days.

(21) Appl. No.: 17/355,874

(22) Filed: Jun. 23, 2021

(65) Prior Publication Data

US 2022/0139880 A1    May 5, 2022

(30) Foreign Application Priority Data

Oct. 29, 2020  (KR) .................. 10-2020-0142013

(51) Int. Cl.
| | |
|---|---|
| *H01L 25/065* | (2023.01) |
| *H01L 25/10* | (2006.01) |
| *H01L 23/00* | (2006.01) |
| *H01L 25/18* | (2023.01) |

(52) U.S. Cl.
CPC .......... *H01L 25/0657* (2013.01); *H01L 24/24* (2013.01); *H01L 25/0652* (2013.01); *H01L 25/105* (2013.01); *H01L 25/18* (2013.01); *H01L 24/08* (2013.01); *H01L 2224/08145* (2013.01); *H01L 2224/08235* (2013.01); *H01L 2224/24227* (2013.01); *H01L 2225/06517* (2013.01); *H01L 2225/06544* (2013.01); *H01L 2225/06548* (2013.01); *H01L 2225/06555* (2013.01); *H01L 2225/06568* (2013.01); *H01L 2225/1035* (2013.01); *H01L 2225/1058* (2013.01)

(58) Field of Classification Search
CPC ........... H01L 24/24; H01L 2224/08235; H01L 2225/06548; H01L 21/76898; H01L 25/0657; H01L 2224/08145; H01L 2225/06555; H01L 2225/06568
See application file for complete search history.

(56) References Cited

U.S. PATENT DOCUMENTS

| | | | |
|---|---|---|---|
| 9,378,778 B1 * | 6/2016 | Walker | ................... G11C 5/147 |
| 9,601,471 B2 | 3/2017 | Zhai et al. | |
| 10,157,885 B2 | 12/2018 | Huang et al. | |
| 10,163,864 B1 | 12/2018 | England | |

(Continued)

*Primary Examiner* — Mamadou L Diallo
(74) *Attorney, Agent, or Firm* — Muir Patent Law, PLLC

(57) ABSTRACT

A semiconductor package includes a first semiconductor chip including a first wiring layer including a first wiring structure and providing a first rear surface, and a first through via for first through via for power electrically connected to the first wiring structure; and a second semiconductor chip including a second wiring layer including a second wiring structure and providing a second rear surface, and a second through via for second through via for power electrically connected to the second wiring structure, wherein the first and second semiconductor chips have different widths, wherein the first semiconductor chip receives power through the first wiring structure and the first through via for first through via for power, wherein the second semiconductor chip receives power through the second wiring structure and the second through via for second through via for power.

20 Claims, 23 Drawing Sheets

(56) References Cited

U.S. PATENT DOCUMENTS

| | | | |
|---|---|---|---|
| 10,461,069 B2* | 10/2019 | Lin | H01L 25/0657 |
| 10,504,852 B1 | 12/2019 | Chen et al. | |
| 10,566,288 B2 | 2/2020 | Kao et al. | |
| 11,195,823 B2* | 12/2021 | Shih | H01L 21/4853 |
| 11,289,525 B2* | 3/2022 | Yamagishi | H01L 27/14636 |
| 2018/0102311 A1* | 4/2018 | Shih | H01L 23/49827 |
| 2019/0131277 A1 | 5/2019 | Yang et al. | |
| 2020/0006324 A1* | 1/2020 | Chen | H01L 24/20 |
| 2020/0027790 A1 | 1/2020 | Huang et al. | |
| 2020/0035672 A1 | 1/2020 | Thei et al. | |
| 2020/0058614 A1* | 2/2020 | Tung | H01L 21/6836 |
| 2020/0058617 A1* | 2/2020 | Wu | H01L 25/50 |
| 2020/0381397 A1* | 12/2020 | Yu | H01L 24/08 |
| 2021/0098423 A1* | 4/2021 | Chen | H01L 21/76807 |
| 2021/0225809 A1* | 7/2021 | Yu | H10B 61/00 |
| 2021/0305226 A1* | 9/2021 | Tsai | H01L 21/6835 |
| 2021/0335735 A1* | 10/2021 | Chen | H01L 24/05 |
| 2021/0375781 A1* | 12/2021 | Lin | G03F 1/42 |
| 2022/0077117 A1* | 3/2022 | Yu | H01L 23/485 |
| 2022/0084968 A1* | 3/2022 | Son | H01L 24/17 |
| 2022/0102245 A1* | 3/2022 | Jang | H01L 23/481 |
| 2022/0139874 A1* | 5/2022 | Lee | H01L 25/50 |
| | | | 257/774 |
| 2022/0262695 A1* | 8/2022 | Chang | H01L 23/5389 |
| 2022/0310691 A1* | 9/2022 | Tsai | H01L 21/7684 |
| 2022/0382003 A1* | 12/2022 | Yu | H04Q 11/0005 |

\* cited by examiner

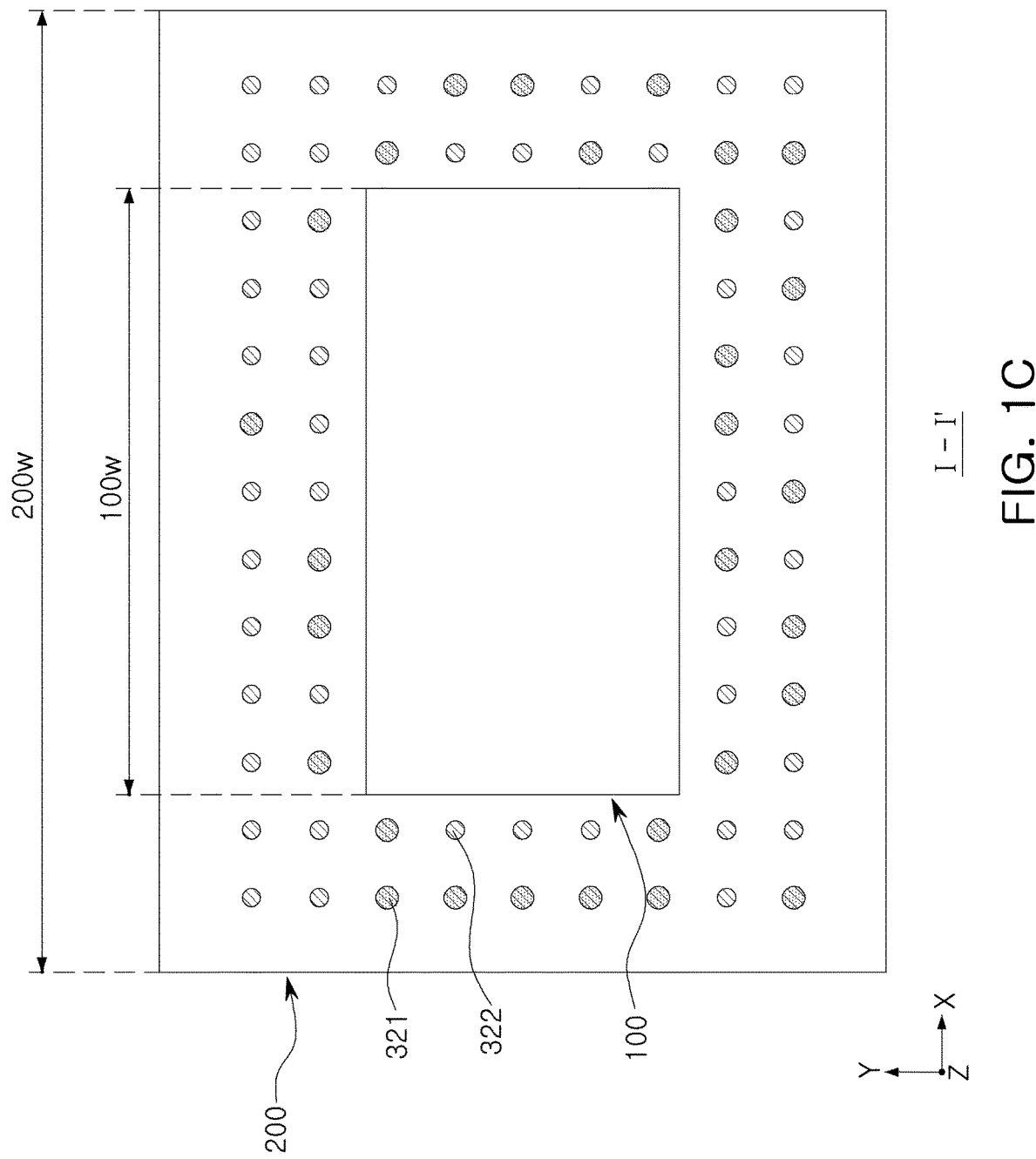

SEMICONDUCTOR PACKAGE

CROSS-REFERENCE TO RELATED APPLICATION

This application claims the priority under 35 U.S.C. § 119 to Korean Patent Application No. 10-2020-0142013, filed on Oct. 29, 2020, with the Korean Intellectual Property Office, the inventive concept of which is herein incorporated by reference.

BACKGROUND

1. Field

The present inventive concept relates to a semiconductor package.

2. Description of Related Art

Semiconductor packages installed in electronic devices are desirable to have high performance and high capacity along with miniaturization. In order to implement the same, research and development of semiconductor packages in which semiconductor chips including through silicon vias TSVs are stacked in a perpendicular direction have been conducted.

SUMMARY

An aspect of the present inventive concept is to provide a semiconductor package in which a voltage drop is reduced, a switching time is shortened, and an occupied area is minimized.

According to an embodiment of the present inventive concept, a semiconductor package includes a first semiconductor chip having a first front surface and a first rear surface, opposite to the first front surface, and including a first circuit layer including a plurality of first individual devices and a first circuit wiring structure electrically connected to the plurality of first individual devices and providing the first front surface, a first wiring layer including a first wiring structure and providing the first rear surface, a first substrate layer disposed between the first circuit layer and the first wiring layer, and a first through via for power penetrating through the first substrate layer and electrically connecting the first circuit wiring structure and the first wiring structure with each other, and a second semiconductor chip disposed on the first semiconductor chip, having a second front surface and a second rear surface, opposite to the second front surface, and including a second circuit layer including a plurality of second individual devices and a second circuit wiring structure electrically connected to the plurality of second individual devices and providing the second front surface, a second wiring layer including a second wiring structure and providing the second rear surface, a second substrate layer disposed between the second circuit layer and the second wiring layer, and a second through via for power penetrating through the second substrate layer and electrically connecting the second circuit wiring structure and the second wiring structure with each other. The first and second semiconductor chips have different widths in a direction, parallel to the first and second front surfaces. The first semiconductor chip receives power through the first wiring structure and the first through via for power. The second semiconductor chip receives power through the second wiring structure and the second through via for power.

According to an embodiment of the present inventive concept, a semiconductor package includes a first semiconductor chip having a first front surface and a first rear surface, opposite to the first front surface, and including a first substrate layer disposed between the first front surface and the first rear surface, a first circuit layer including a first circuit wiring structure and providing the first front surface and disposed on the first substrate layer, and a first through via for power penetrating through the first substrate layer and electrically connected to the first circuit wiring structure, a second semiconductor chip having a second front surface and a second rear surface, opposite to the second front surface, and including a second substrate layer disposed between the second front surface and the second rear surface, a second circuit layer including a second circuit wiring structure and providing the second front surface and disposed on the second substrate layer, and a second through via for power penetrating through the second substrate layer and electrically connected to the second circuit wiring structure, the second semiconductor chip being disposed on the first semiconductor chip such that the second rear surface faces the first front surface, an encapsulation layer covering at least a portion of each of a side surface of the first semiconductor chip and the second rear surface of the second semiconductor chip, a third through via for power penetrating through the encapsulation layer and electrically connected to the second through via for power, and a plurality of connection bumps disposed on a lower surface of the encapsulation layer. The first through via for power is electrically connected to a corresponding one of the plurality of connection bumps and the third through via for power is connected to a corresponding one of the plurality of connection bumps. A width of the first semiconductor chip is narrower than a width of the second semiconductor chip.

According to an embodiment of the present inventive concept, a semiconductor package includes a first semiconductor chip having a first front surface and a first rear surface, opposite to the first front surface, and including a first substrate layer disposed between the first front surface and the first rear surface, a first circuit layer including a first circuit structure and providing the first front surface and disposed on the first substrate layer, and a first through via for power penetrating through the first substrate layer and electrically connected to the first circuit structure, a second semiconductor chip having a second front surface and a second rear surface, opposite to the second front surface, and including a second substrate layer disposed between the second front surface and the second rear surface, a second circuit layer including a second circuit structure and providing the second front surface and disposed on the second substrate layer, and a second through via for power penetrating through the second substrate layer and electrically connected to the second circuit structure, the second semiconductor chip being disposed on the first semiconductor chip such that the second front surface faces the first front surface, an encapsulation layer covering at least a portion of each of a side surface of the first semiconductor chip and a side surface of the second semiconductor chip, a third through via for power penetrating through the encapsulation layer and adjacent to the side surface of the first semiconductor chip and the side surface of the second semiconductor chip, and an upper redistribution structure disposed on the encapsulation layer to electrically connect the third through via for power and the second through via for power with each other. The first semiconductor chip receives power through the first through via for power, and the second semiconductor chip receives power through the third through via for power, the upper redistribution structure, and the second through via for power.

According to an embodiment of the present inventive concept, a semiconductor package includes a lower redistribution wiring layer provided with a plurality of power bumps at a lower surface of the lower redistribution wiring layer, a first semiconductor chip including a first substrate, the first substrate being disposed on an upper surface of the lower redistribution wiring layer and having a first active surface and a first backside surface, the first semiconductor chip including a plurality of first transistors which are formed at the first active surface of the first substrate, and the first semiconductor chip further including a plurality of first circuit wirings connected to the plurality of first transistors and disposed on the first active surface of the first substrate, a second semiconductor chip including a second substrate, the second substrate having a second active surface and a second backside surface, the second semiconductor chip including a plurality of second transistors which are formed at the second active surface of the second substrate and the second substrate being stacked on the first substrate such that the first active surface and the second active surface are disposed between the first backside surface and the second backside surface, and the second semiconductor chip further including a plurality of second circuit wirings connected to the plurality of second transistors and disposed on the second active surface, a first through via for power electrically connected to a corresponding one of the plurality of power bumps and penetrating the first substrate to provide a first power to the plurality of first transistors, a second through via for power penetrating the second substrate, an upper redistribution wiring layer disposed on the second backside surface of the second substrate, and a third through via for power extending from the upper surface of the lower redistribution wiring layer to a lower surface of the upper redistribution wiring layer, the third through via being electrically connected to a corresponding one of the plurality of power bumps through the lower redistribution wiring layer and the second through via for power through the upper redistribution wiring layer to provide a second power to the plurality of second transistors.

BRIEF DESCRIPTION OF DRAWINGS

The above and other aspects, features, and advantages of the present inventive concept will be more clearly understood from the following detailed description taken in conjunction with the accompanying drawings, in which:

FIGS. 1A to 1C are diagrams illustrating a semiconductor package according to an example embodiment of the present inventive concept;

DETAILED DESCRIPTION

Hereinafter, example embodiments of the present inventive concept will be described with reference to the accompanying drawings as follows.

Figure 1A:
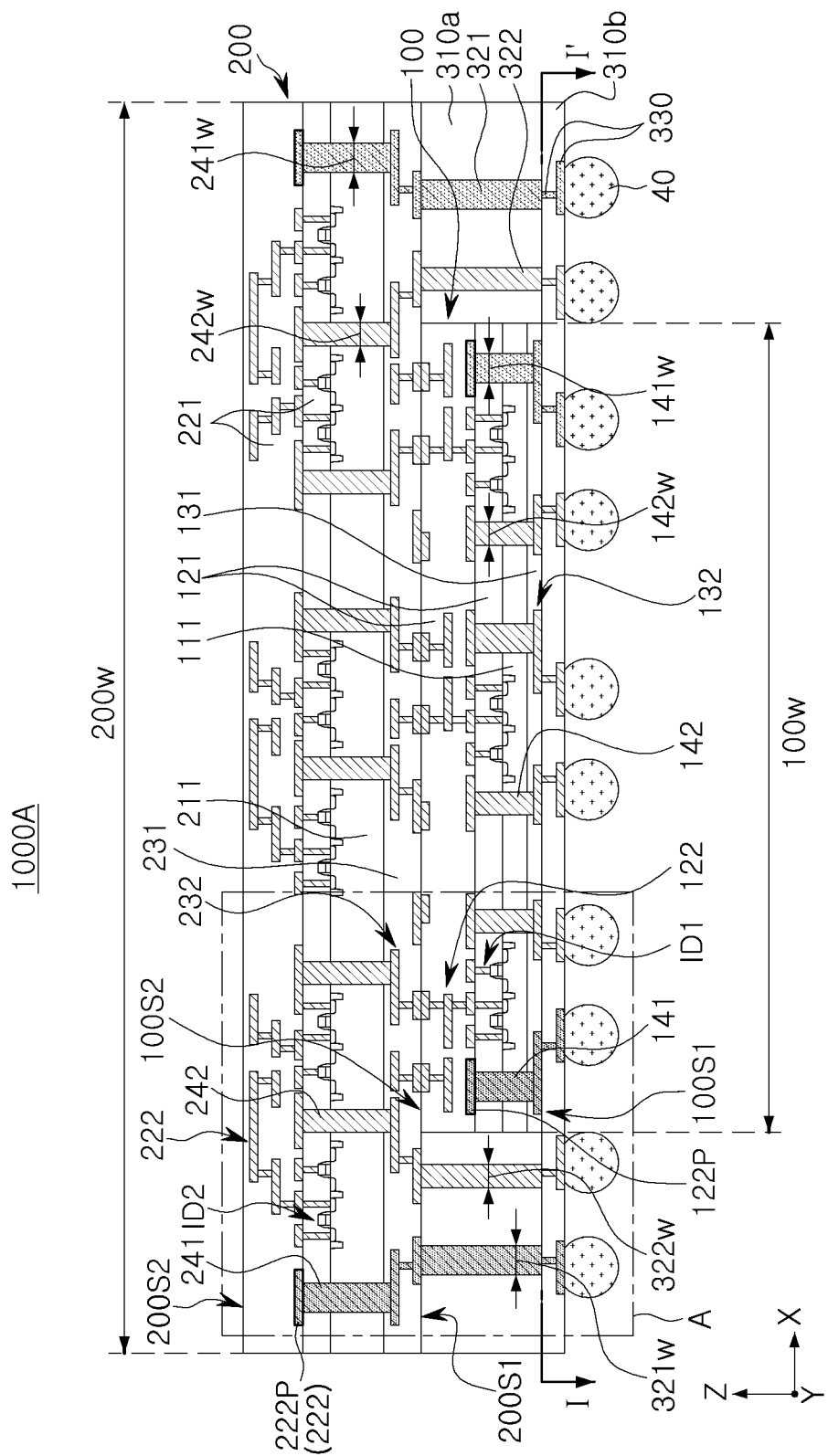
Figure 1B:
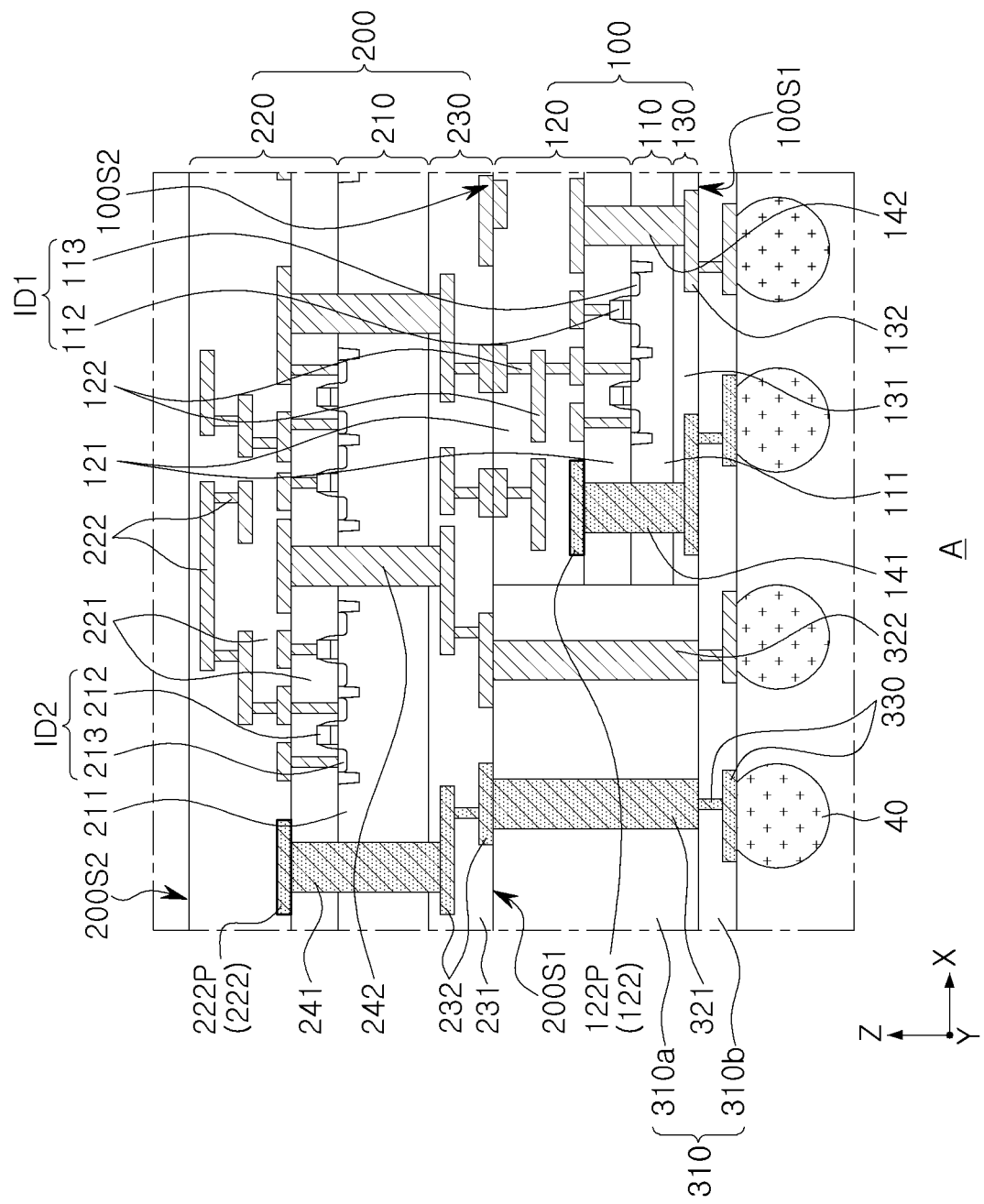

FIGS. 1A to 1C are diagrams illustrating a semiconductor package 1000A according to an example embodiment of the present inventive concept. FIG. 1A is a cross-sectional diagram schematically illustrating a vertical cross-section of a semiconductor package 1000A, FIG. 1B is an enlarged diagram of a region "A" of FIG. 1A, and FIG. 1C is a plan diagram illustrating a cross-section taken along line I-I' of FIG. 1A. In FIG. 1C, some components included in first and second semiconductor chips 100 and 200 are omitted. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Referring to FIGS. 1A to 1C, the semiconductor package 1000A may include a first semiconductor chip 100 and a second semiconductor chip 200 stacked in a perpendicular direction (Z-axis direction). The semiconductor package 1000A may include third through vias 321 and 322 electrically connected to the second semiconductor chip 200. The first and second semiconductor chips 100 and 200 may have a hybrid bonding structure in which a first forward surface 100S2 (i.e., a first front surface) of the first semiconductor chip 100, and a second forward surface 200S2 (i.e., a second front surface) or a second rear surface 200S1 of the second semiconductor chip 200 are directly attached to each other without using a separate connection member (e.g., solder bump, copper pillar, etc.). For example, the first semiconductor chip 100 and the second semiconductor chip 200 may be electrically connected to each other through a first circuit structure 122 and a second circuit structure 222 or a second wiring structure 232, and the first circuit structure 122 may contact the second circuit structure 222 or the second wiring structure 232. In an embodiment, the first semiconductor chip 100 and the second semiconductor chip 200 are electrically connected to each other through the first circuit structure 122 and the second wiring structure 232 which contact each other. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to, or "directly disposed on" another element, or as "contacting" or "in contact with" another element, there are no intervening elements present at the point of contact.

The first semiconductor chip 100 may have the first forward surface 100S2 (i.e., a first front surface) and the first rear surface 100S1 located opposite to the first forward surface 100S2, a first substrate layer 110, a first circuit layer 120, a first wiring layer 130, and the first through via for power and the first through via for the signal 141 and 142.

The first substrate layer 110 may be disposed between the first circuit layer 120 and the first wiring layer 130 or between the first forward surface 100S2 and the first rear surface 100S1, and may include a semiconductor layer 111 (i.e., a semiconductor substrate) having an upper surface and a lower surface located opposite to each other, a plurality of conductive regions 113 formed in the semiconductor layer 111, and separation regions on one side of the conductive regions 113. The first substrate layer 110 may be a semiconductor wafer. The semiconductor layer 111 may include or may be formed of a semiconductor material such silicon or germanium, or a compound semiconductor such as silicon carbide (SiC), gallium arsenide (GaAs), indium arsenide (InAs), and indium phosphide (InP). The conductive region 113 (e.g., a source/drain region) may be, for example, a region doped with impurities or a structure doped with impurities. The isolation region has a device isolation structure having a shallow trench isolation (STI) structure, and may include or may be formed of silicon oxide.

The first circuit layer 120 may provide the first forward surface 100S2 of the first semiconductor chip 100, and may be disposed on an upper surface of the first substrate layer 110. The first circuit layer 120 may include a first interlayer insulating layer 121, a plurality of first individual devices ID1, and a first circuit structure 122 electrically connected to the plurality of first individual devices ID1. In an embodiment, the plurality of first individual devices ID1 are formed at the upper surface of the semiconductor layer 111, which may be referred to an active surface. The first interlayer insulating layer 121 may be disposed on the upper surface of the first substrate layer 110 or the upper surface of the semiconductor layer 111, and may include or may be formed of silicon oxide or silicon nitride. The plurality of first individual devices ID1 may include or may be various microelectronic devices, for example, a metal-oxide-semiconductor field effect transistor (MOSFET), a system large scale integration (LSI), and a micro-electro-mechanical system, an active device, a passive device, and the like. The plurality of first individual devices ID1 may include a gate structure 112 disposed between the conductive regions 113.

The first circuit structure 122 (i.e., a first circuit wiring structure) may include at least one or more wiring lines extending in a parallel direction (X-axis direction), and at least one or more wiring vias extending in a perpendicular direction (Y-axis direction), and may be electrically connected to a plurality of first individual devices ID1. The first circuit structure 122 may have a multilayer structure including a plurality of wiring lines and a plurality of wiring vias. The wiring line of the first circuit structure 122 may contact the first through via for power and the first through via for the signal 141 and 142. The wiring line of the first circuit structure 122 may also be connected to another wiring line through a wiring via. Wiring lines and wiring vias may include or may be formed of, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier film including titanium (Ti), titanium nitride (TiN), tantalum (Ta), or tantalum nitride (TaN) may be disposed between the wiring line or/and the wiring via and the first interlayer insulating layer 121. The first circuit structure 122 may also interconnect the first individual devices ID1 to each other or may connect the first individual devices ID1 to each of the first through via for power and the first through via for the signal 141 and 142. For example, the first circuit structure 122 may connect the first individual devices ID with each other to constitute an integrated circuit, connect the first individual devices ID and the first through via for power 141 with each other so that power is delivered through the first through via for the power 141 to the first individual devices ID1, or connect the first individual devices ID1 and the first through via for the signal 142 so that a signal is delivered to or from the first individual devices ID1 via the first through via for the signal 142.

The plurality of first individual devices ID1 and the first circuit structure 122 may be combined to form a first integrated circuit. The first integrated circuit may include at least one of a logic circuit, an input/output circuit, an analog circuit, a memory circuit, and a series-parallel conversion circuit. The logic circuit may include at least one of a central processing unit (CPU), a graphics processing unit (GPU), a field programmable gate array (FPGA), a digital signal processing unit (DSP), an image signal processing unit (ISP), an encryption processor, a microprocessor, a microcontroller, an analog-to-digital converter, and an application specific integrated circuit (ASIC). The memory circuit may include volatile memory circuits such as dynamic random access memory (DRAM) and static random access memory (SRAM), and the like, or non-volatile memory circuits such as phase change random access memory (PRAM), magnetic random access memory (MRAM), resistive random access memory (RRAM), a flash memory, and the like.

The first wiring layer 130 may provide a first rear surface 100S1 of the first semiconductor chip 100, and may be disposed on a lower surface of the first substrate layer 110. The first wiring layer 130 may include a rear interlayer insulating layer 131 and a first wiring structure 132 electrically connected to the first circuit structure 122. The rear interlayer insulating layer 131 may be disposed on the lower surface of the first substrate layer 110 or the lower surface of the first semiconductor layer 111, and may include or may be formed of silicon oxide or silicon nitride. The first wiring structure 132 may have a single layer structure or a multi-layer structure. In the drawings, only one layer of wiring lines directly connected to the first through via for power and the first through via for the signal 141 and 142 is illustrated in the first wiring structure 132. Alternatively, similar to the first circuit structure 122, the first wiring structure 132 may include at least one or more layer of wiring lines and at least one or more layer of wiring vias. A passivation film may be further disposed on the lower surface of the first wiring layer 130 or on the first rear surface 100S1 of the first semiconductor chip 100. The passivation film may be an insulating layer including silicon oxide, silicon nitride, polymer, or a combination thereof. The passivation film may cover a portion (e.g., a rear pad) of the first wiring structure 132 exposed to the first rear surface 100S1 of the first semiconductor chip 100.

The first through via for power and the first through via for the signal 141 and 142 may penetrate through at least a portion of the first semiconductor chip 100 to electrically connect the first circuit structure 122 and the first wiring structure 132 with each other. For example, the first through via for power and the first through via for the signal 141 and

142 may include a first through via for power 141 and a first through via for a signal 142 penetrating through the first substrate layer 110 to be electrically connected to the first circuit structure 122 and the first wiring structure 132. A width 141w of the first through via for power 141 in a parallel direction (X-axis direction) may be equal to or greater than a width 142w of the first through via for a signal 142. The width 141w of the first through via for power 141 may have a value from about 1 μm to about 10 μm or from about 3 μm to about 8 μm. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first through via for power and the first through via for the signal 141 and 142 may include a metal plug extending in a perpendicular direction (Z-axis direction) between the first forward surface 100S2 and the first rear surface 100S1 of the first semiconductor chip 100, and a barrier film surrounding a side surface of the metal plug. The metal plug may include or may be formed of, for example, tungsten (W), titanium (Ti), aluminum (Al), or copper (Cu). The metal plug may be formed by a plating process, a physical vapor deposition (PVD) process or a chemical vapor deposition (CVD) process. The barrier film may include or may be formed of a metal compound such as tungsten nitride (WN), titanium nitride (TiN), or tantalum nitride (TaN). The barrier film may be formed by a PVD process or a CVD process. A via insulating film may be formed on side surfaces of the first through via for power and the first through via for the signal 141 and 142. The via insulating film may be a single film or a multilayer film. The via insulating film may include or may be formed of silicon oxide, silicon oxynitride, silicon nitride, polymer, or a combination thereof.

The second semiconductor chip 200 may have the second forward surface 200S2 and the second rear surface 200S1, located opposite to the second forward surface 200S2, and may include a second substrate layer 210 (i.e., a second substrate), a second circuit layer 220, a second wiring layer 230 and second through vias 241 and 242. Since the second semiconductor chip 200 may include the same or similar technical features as the first semiconductor chip 100 described above, a redundant description thereof will be omitted.

The second semiconductor chip 200 may provide a second integrated circuit in which a plurality of second individual devices ID2 (e.g., a plurality of transistors) and a second circuit structure 222 (i.e., a second circuit wiring structure) are connected with each other. In an embodiment, the plurality of second individual devices ID are formed at an upper surface of the second substrate layer 210, which may be referred to as an active surface of the second substrate layer 210. The second integrated circuit may include at least one of a logic circuit, an input/output circuit, an analog circuit, a memory circuit, and a series-parallel conversion circuit. The second integrated circuit may be combined with the first integrated circuit to implement a logic circuit. For example, the first semiconductor chip 100 and the second semiconductor chip 200 may be combined with each other, such that a central processing unit (CPU), a graphic processing unit (GPU), a field programmable gate array (FPGA), a digital signal processing unit (DSP), an image signal processing device (ISP), an encryption processor, a microprocessor, a microcontroller, an analog-to-digital converter, and an application-specific integrated circuit (ASIC), and the like may be implemented.

As described above, in a semiconductor package in which a plurality of semiconductor chips are stacked, when a power wiring for supplying power to the semiconductor chips is formed on a forward surface of the semiconductor chip or on a circuit layer, a degree of congestion of the circuit structure may increase, such that a voltage drop may increase, and a switching time may increase. In an example embodiment of the present inventive concept, the first semiconductor chip 100 and the second semiconductor chip 200 may receive power through the rear surfaces 100S1 and 200S1 of each of the first and second semiconductor chips, respectively. Accordingly, a degree of congestion between the first circuit layer 120 and the second circuit layer 220 may be reduced, such that a voltage drop may be reduced, and a switching time may be shortened. Since one large-area semiconductor chip is divided and stacked in a perpendicular direction (Z-axis direction), an area occupied by the semiconductor package may be minimized.

For example, in a direction, parallel (X-axis direction) to the first and second forward surfaces 100S2 and 200S2, the first and second semiconductor chips 100 and 200 may have different widths 100w and 200w from each other, and the first semiconductor chip 100 may receive power through the first wiring structure 132 and the first through via for power 141, and the second semiconductor chip 200 may receive power through the second wiring structure 232 and the second through via for power 241. The second semiconductor chip 200 disposed above the first semiconductor chip 100 may receive power through at least a portion of the plurality of third through vias 321 and 322 surrounding the side surface of the first semiconductor chip 100. The first through via for power 141 may be connected to a power rail 122P of the first circuit structure 122 supplying power to the first individual devices ID1. The second through via for power 241 may be connected to a power rail 222P of the second circuit structure 222 supplying power to the second individual devices ID2. In FIG. 1A, the power rails 122P and 222P connected to the first through via for power and the second through via for power 141 and 241 are illustrated to be disposed on a level higher than the individual devices ID1 and ID2, but are not limited thereto, and may be disposed on the same level as or on a lower level than the individual devices ID1 and ID2. In the drawing, the first through via for power and the second through via for power 141 and 241 may be in direct contact with the power rails 122P and 222P. The present inventive concept is not limited thereto. For example, the first through via for power and the second through via for power 141 and 241 may be connected through separate contact plugs or the like to the power rails 122P and 222P.

In one example embodiment, in order to secure a space for forming the third through vias 321 and 322, the width 100w of the first semiconductor chip 100 may be narrower than the width 200w of the second semiconductor chip 200, and a ratio of planar areas of the first and second semiconductor chips 100 and 200 may be 1:2 or more. For example, a ratio of the planar area of the first semiconductor chip 100 to the planar area of the second semiconductor chip 200 may be in a range of 1:2 to 1:10 or 1:2 to 1:5. The semiconductor package 1000A may further include an encapsulation layer 310 covering at least one side surface of the first and second semiconductor chips 100 and 200, third through vias 321 and 322 penetrating through the encapsulation layer 310, and a redistribution structure 330 connecting the third through vias 321 and 322 to a plurality of external connection bumps 40 (hereinafter, referred to as 'connection bumps').

The encapsulation layer 310 may encapsulate the first and second semiconductor chips 100 and 200, and may include or may be formed of silicon oxide, silicon nitride, or a polymer. For example, the encapsulation layer 310 may cover at least a portion of each of a side surface of the first semiconductor chip 100 and a second rear surface 200S1 of the second semiconductor chip 200. The encapsulation layer 310 may include a first encapsulation layer 310a covering at least a portion of each of the side surface of the first semiconductor chip 100 and the second rear surface 200S1 of the second semiconductor chip 200 and a second encapsulation layer 310b disposed on the first encapsulation layer 310a and covering the first rear surface 100S1 of the first semiconductor chip 100. Each of the first encapsulation layer 310a and the second encapsulation layer 310b may include or may be formed of at least one of silicon oxide, silicon nitride, or polymer. In one example, the first encapsulation layer 310a and the second encapsulation layer 310b may include or may be formed of the same material, and a boundary between the first encapsulation layer 310a and the second encapsulation layer 310b is not or may be barely distinguished.

The third through vias 321 and 322 may include a third through via for power 321 and a third signal through via 322. Since the third through vias 321 and 322 have the same or similar characteristics to the first and second through vias 141, 142, 241, and 242 as described above, redundant descriptions thereof are omitted. The third through via for power 321 may penetrate through the encapsulation layer 310 and be connected to the second wiring structure 232, and may supply power to the second semiconductor chip 200. Widths 321w and 322w of the third through vias 321 and 322 may have a size, similar to the widths 141w, 142w, 241w, and 242w of the first and second through vias 141, 142, 241, and 242. The widths 321w and 322w of the third through vias 321 and 322 may range from about 1 µm to about 10 µm or from about 3 µm to about 8 µm.

The redistribution structure 330 may include one or more layers of redistribution lines extending in a parallel direction (X-axis or Y-axis direction) and one or more layers of redistribution vias extending in a perpendicular direction (Z-axis direction). The redistribution structure 330 may have a single-layer structure in which the redistribution line contacts the first wiring structure 132 or the third through vias 321 and 322 without a redistribution via, or a multi-layered structure including a plurality of redistribution lines and a plurality of redistribution vias. In one example, the redistribution structure 330 may be omitted, and connection bumps 40 may be directly disposed on the first wiring structure 132.

The plurality of connection bumps 40 may be disposed on the lower surface of the encapsulation layer 310, and may be electrically connected to the first through via for power and the first through via for the signal 141 and 142 and the third through vias 321 and 322. The plurality of connection bumps 40 may face or may be adjacent to the first rear surface 100S1 of the first semiconductor chip 100 and the second rear surface 200S1 of the second semiconductor chip 200. At least a portion of the connection bumps 40 connected to the first through via for power 141 and the third through via for power 321 may receive power/ground signals of the first and second semiconductor chips 100 and 200 and may transmit the received power/ground signals thereto.

The power vias described above may also be used as ground vias. The remaining portion of the connection bumps 40 connected to the first through via for a signal 142 and the third signal through via 322 may receive input/output signals of the first and second semiconductor chips 100 and 200 from the outside or may output input/output signals to the outside. The third signal through via 322 may be connected to a second through via for a signal 242 spaced apart from the third through via for power 321 and connected to the second circuit structure 222. The second through via for a signal 242 may be electrically connected to the first circuit structure 122, to electrically connect the second individual devices ID2 and the first individual devices ID1 with each other. The plurality of connection bumps 40 may include or may be formed of a conductive material, and a material thereof is not particularly limited. The plurality of connection bumps 40 may have a land, a ball, or a pin structure.

Figure 2:
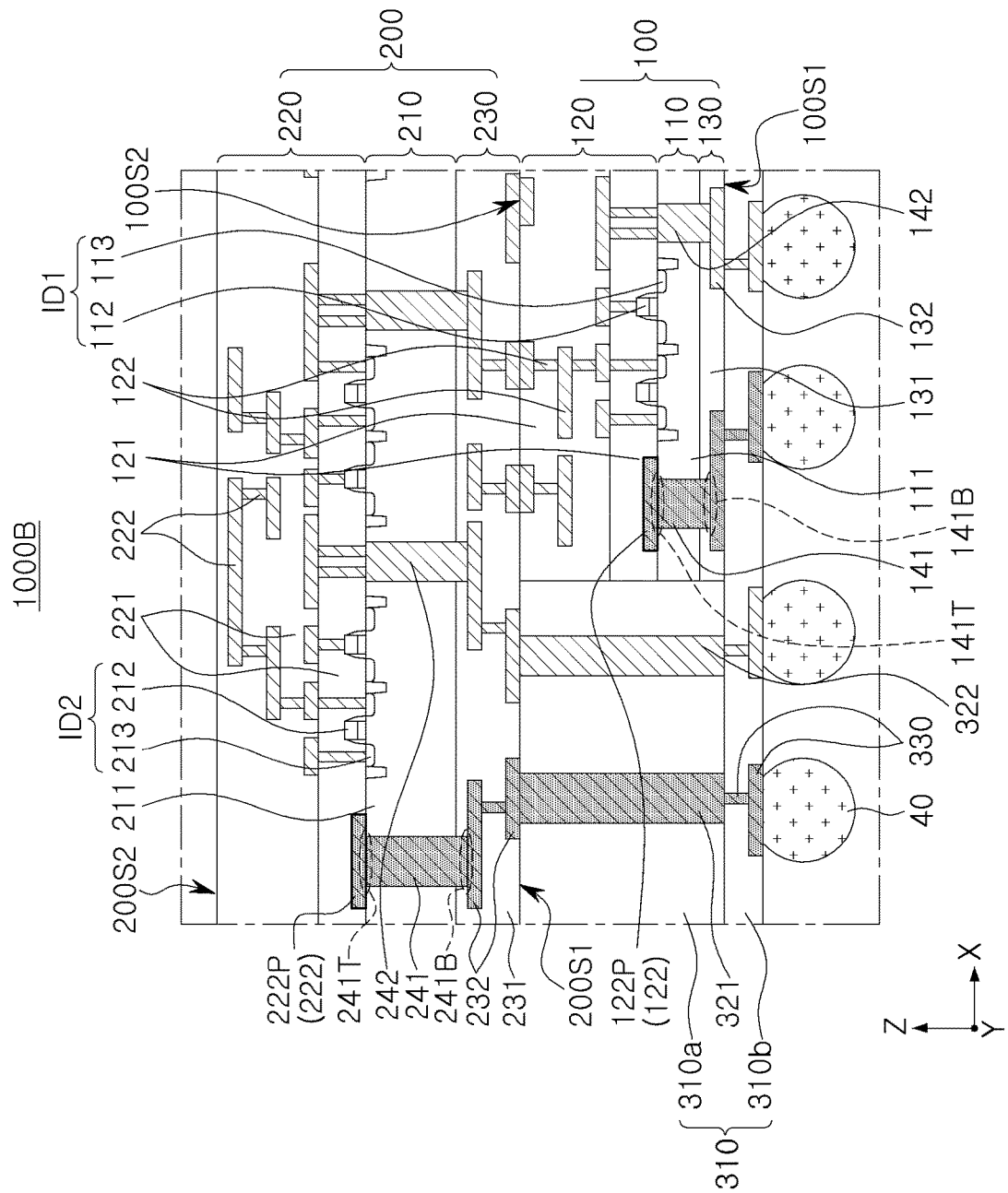
FIG. 2 is a diagram illustrating a semiconductor package according to an example embodiment of the present inventive concept.

FIG. 2 is a diagram illustrating a semiconductor package 1000B according to an example embodiment of the present inventive concept. FIG. 2 is a partially enlarged diagram illustrating a portion of the semiconductor package 1000B corresponding to FIG. 1B.

Referring to FIG. 2, in the semiconductor package 1000B, first end portions (e.g., 141B and 241B) of first and second through vias 141, 142, 241, and 242 may be disposed in the first and second wiring layers 130 and 230, respectively, and the other end (e.g., 141T and 241T) may be located within the first and second circuit layers 120 and 220 or the first and second substrate layers 110 and 210. For example, a first end portion 141B of the first through via for power 141 may be located in the first wiring layer 130, and a second end portion 141T, located opposite to the first end portion 141B, may be disposed in the first substrate layer 110, a first end portion 241B of the second through via for power 241 may be disposed within the second wiring layer 230, and the second end portion 241T, disposed opposite to the first end portion 241B, may be disposed within the second substrate layer 210.

The first end portions 141B and 241B of the first through via for power and the second through via for power 141 and 241 may be surrounded by rear interlayer insulating layers 131 and 231, respectively. The second end portions 141T and 241T of each of the first through via for power and the second through via for power 141 and 241 may be connected to power rails 122P and 222P supplying power to individual devices ID1 and ID2, respectively. In the drawing, the power rails 122P and 222P connected to the second end portions 141T and 241T of each of the first through via for power and the second through via for power 141 and 241 are shown to be disposed on the same level as the individual devices ID1 and ID2. However, the present inventive concept is not limited thereto, and may be disposed at a level, lower than that of the individual devices ID1 and ID2. Through vias for first and second signals 142 and 242 may penetrate through the first and second substrate layers 110 and 210, respectively. Through vias for first and second signals 142 and 242 may be connected to a wiring of a first circuit structure 122 and a second circuit structure 222 through wiring vias, respectively.

Figure 3A:
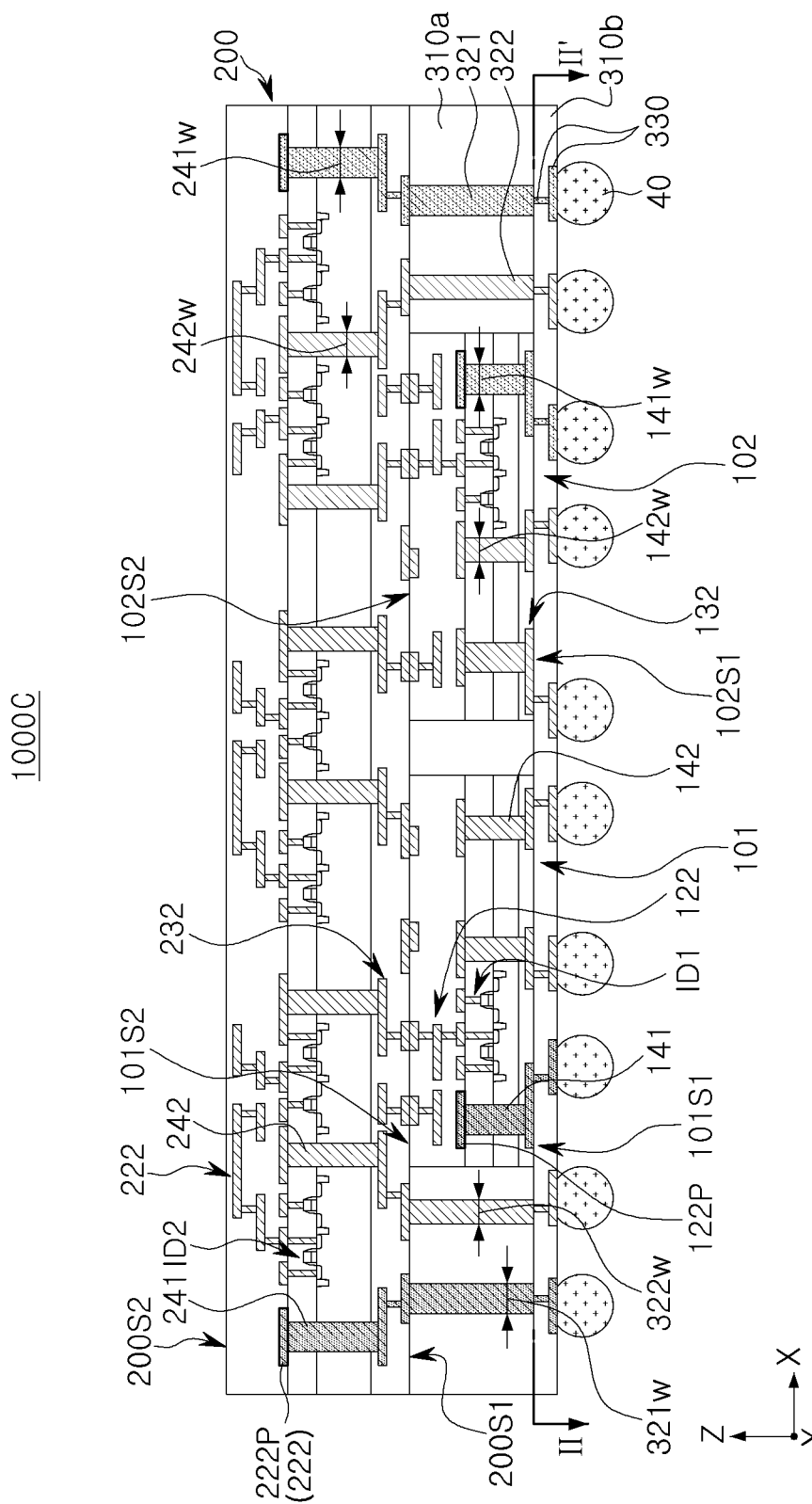
FIGS. 3A and 3B are diagrams illustrating a semiconductor package according to an example embodiment of the present inventive concept.
Figure 3B:
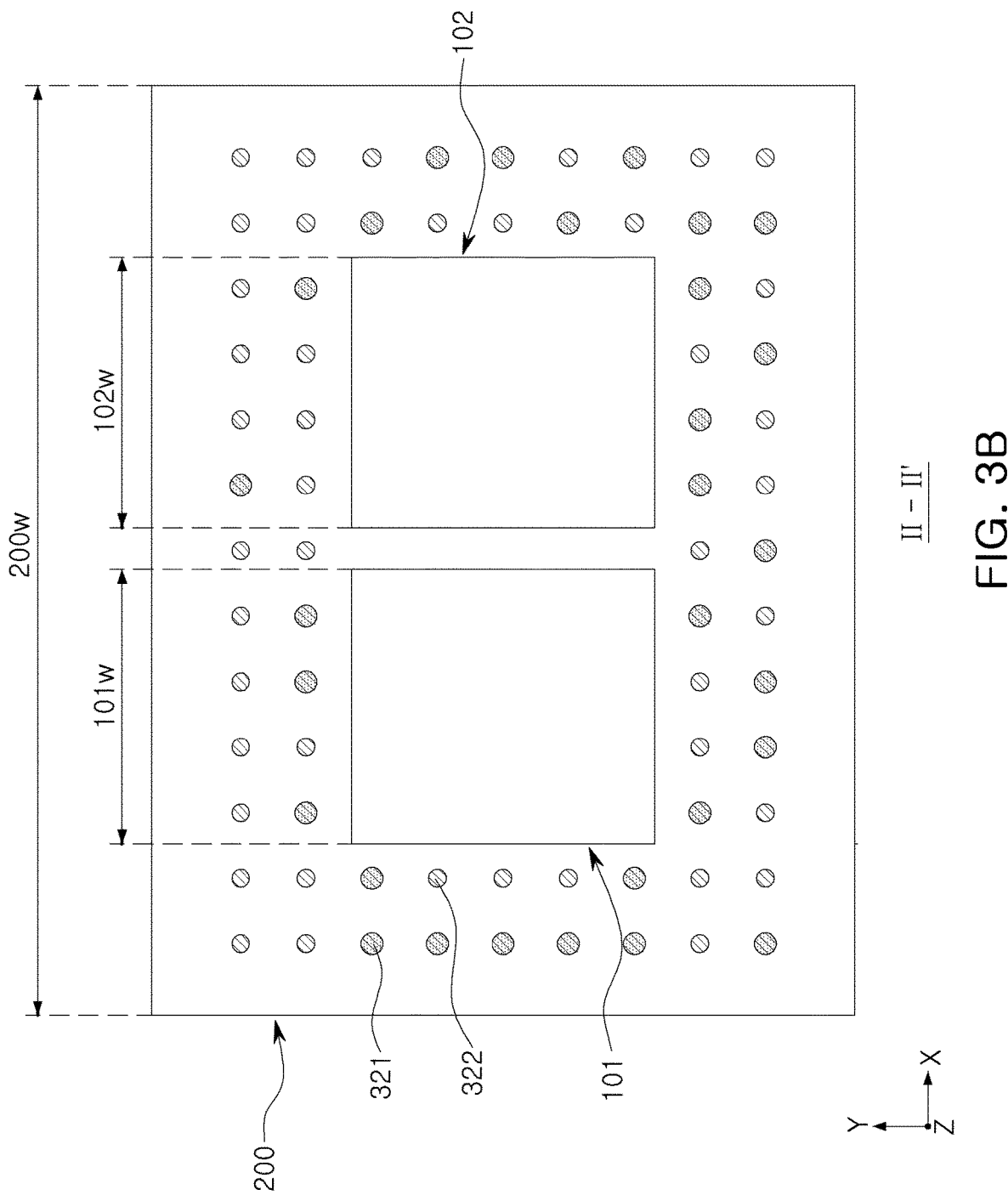

FIGS. 3A and 3B are diagrams illustrating a semiconductor package 1000C according to an example embodiment of the present inventive concept. FIG. 3A is a cross-sectional diagram illustrating a vertical cross-section of the semiconductor package 1000C, and FIG. 3B is a plan diagram illustrating a cross-section taken along line II-II' of FIG. 3A.

Referring to FIGS. 3A and 3B, the semiconductor package 1000C may include a plurality of first semiconductor chips spaced apart from each other on the second rear surface 200S1 of the second semiconductor chip 200. Each of the plurality of semiconductor chips may include elements of the first semiconductor chip 100 as described above. For example, a 1-1 semiconductor chip 101 and a 1-2 semiconductor chip 102 may be disposed on the second rear surface 200S1 of the second semiconductor chip 200. The 1-1 semiconductor chip 101 and the 1-2 semiconductor chip 102 may be spaced apart from each other in a parallel direction (X-axis direction). In the parallel direction (X-axis direction), a sum of a width 101w of the 1-1 semiconductor chip 101 and a width 102w of the 1-2 semiconductor chip 102 may be narrower than a width 200w of the second semiconductor chip 200. In an embodiment, the 1-1 semiconductor chip 101 and the 1-2 semiconductor chip 102 are the same device. The present invention is not limited thereto. For example, the 1-1 semiconductor chip 101 and the 1-2 semiconductor chip 102 may be different devices from each other, and the width 101w of the 1-1 semiconductor chip 101 and the width 102w of the 1-2 semiconductor chip 102 may be different from each other. Each of the width 101w and the width 102w may be narrower than the width 200w, and a sum of the width 101w and the width 102w may be narrower than the width 200w.

When the semiconductor package 1000C is viewed in a plan view, a plurality of third through vias 321 and 322 may be disposed around an outer boundary formed by the 1-1 semiconductor chip 101 and the 1-2 semiconductor chip 102. In FIG. 3B, third through vias 321 and 322 are not present in the space between the 1-1 semiconductor chip 101 and the 1-2 semiconductor chip 102. The present invention is not limited thereto. For example, the third through vias 321 and 322 may also be disposed in the space between the 1-1 semiconductor chip 101 and the 1-2 semiconductor chip 102. In order to from the third through vias 321 and 322 connected to the second semiconductor chip 200, a ratio of a sum of planar areas of the 1-1 semiconductor chip 101 and the 1-2 semiconductor chip 102 to a planar area of the second semiconductor chip 200 may be 1:2 or more.

The 1-1 semiconductor chip 101 and the 1-2 semiconductor chip 102 may be combined with the second semiconductor chip 200 to provide a single logic chip. For example, the 1-1 semiconductor chip 101 and the 1-2 semiconductor chip 102 may include an input/output circuit, an analog circuit, a memory circuit, a series-parallel conversion circuit, and the like, and the second semiconductor chip 200 may include a CPU circuit.

Figure 4:
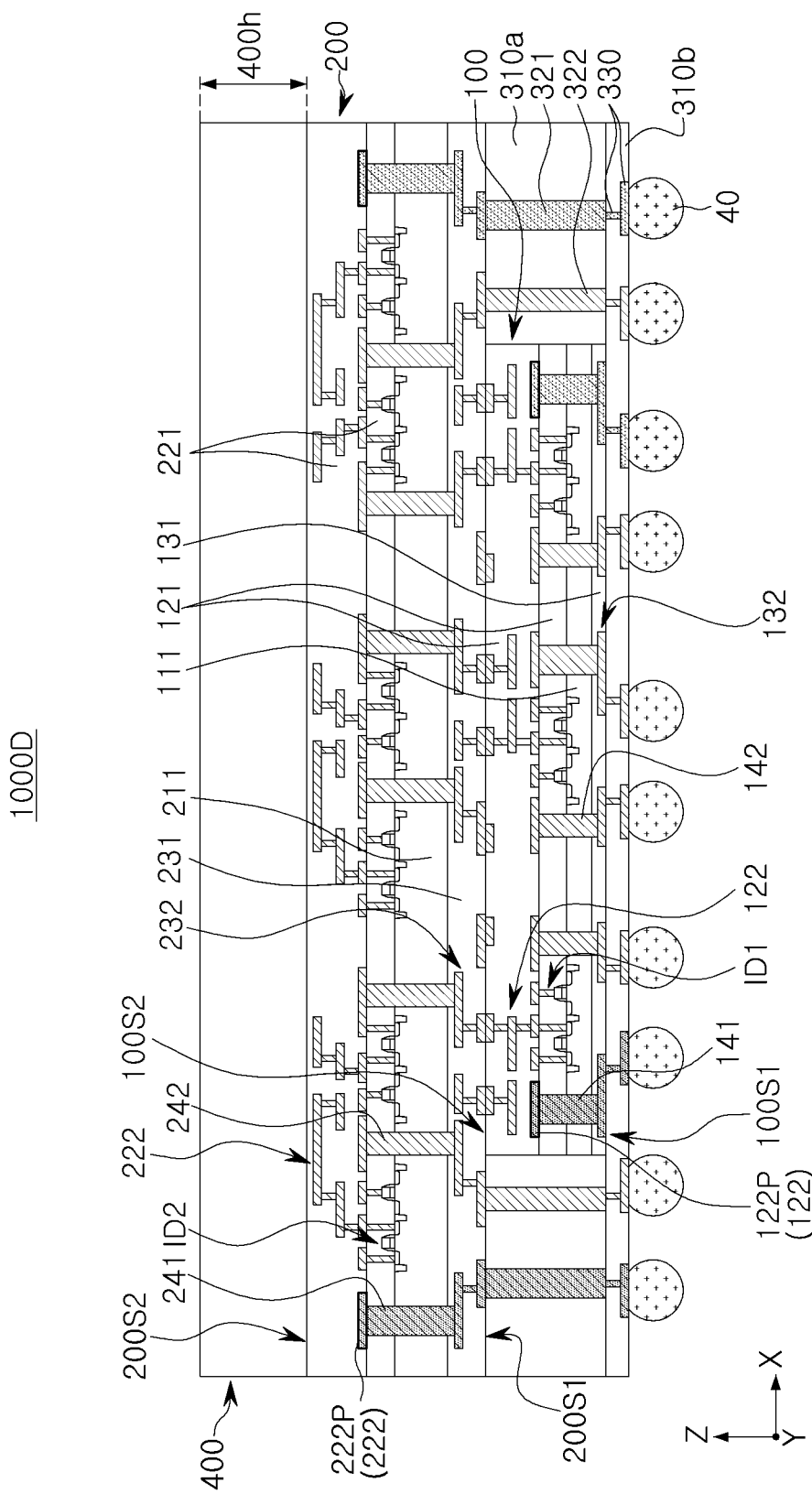
FIG. 4 is a diagram illustrating a semiconductor package according to an example embodiment of the present inventive concept.

FIG. 4 is a diagram illustrating a semiconductor package 1000D according to an example embodiment of the present inventive concept. FIG. 4 is a cross-sectional diagram illustrating a vertical cross-section of the semiconductor package 1000D.

Referring to FIG. 4, a semiconductor package 1000D may further include a dummy semiconductor chip 400 disposed above the semiconductor package 1000A of FIG. 1A. For example, the semiconductor package 1000D may further include a dummy semiconductor chip 400 disposed on the second forward surface 200S2 of the second semiconductor chip 200. The dummy semiconductor chip 400 may have a predetermined thickness 400h. The dummy semiconductor chip 400 may be used as a carrier in a process of manufacturing process the semiconductor package 1000D. The dummy semiconductor chip 400 is not removed after the process of manufacturing the package, and may be partially polished and processed to have a predetermined thickness 400h in order to secure a thickness required for the semiconductor package.

Hereinafter, a method of manufacturing the semiconductor package of FIG. 4 will be described with reference to FIGS. 5A to 5E. FIGS. 5A to 5E are diagrams schematically illustrating a method of manufacturing the semiconductor package 1000D of FIG. 4.

Figure 5A:
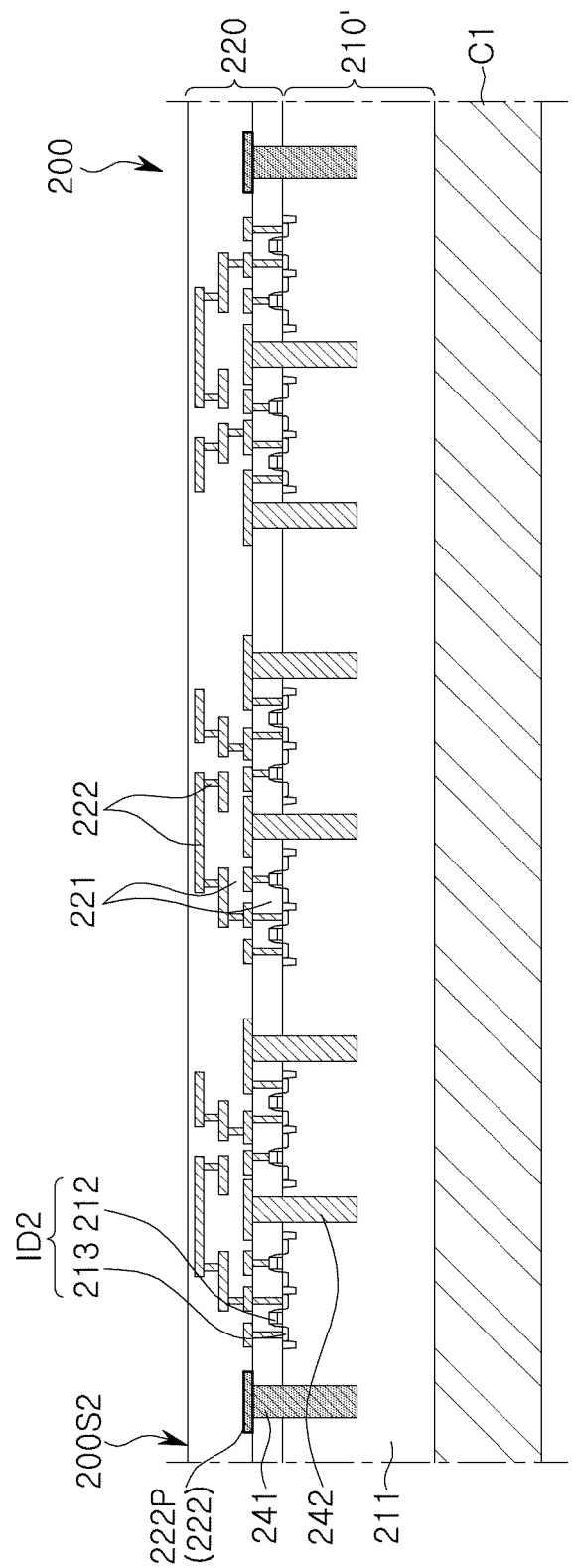
FIGS. 5A to 5E are diagrams schematically illustrating a method of manufacturing the semiconductor package of FIG. 4.

Referring to FIG. 5A, second individual devices ID2, second through vias 241 and 242, and a second circuit layer 220 may be sequentially formed on a second substrate layer 210' attached to a carrier C1. The carrier C1 may be a resin substrate or a glass substrate including an adhesive layer. The second substrate layer 210' may be in a state of a semiconductor wafer before dicing. The second individual devices ID2 may include a gate structure 212 and a doped region 213. The doped region 213 may be formed by doping an impurity on the semiconductor layer 211. The gate structure 212 may be formed by CVD and PVD processes. The second circuit layer 220 may include a second interlayer insulating layer 221 and a second circuit structure 222. The second interlayer insulating layer 221 may include or may be formed of a silicon oxide film. The second circuit structure 222 may include multilayered wiring lines and wiring vias. The second circuit structure 222 may be formed by repeatedly performing a photolithography process, an etching process, and a plating process.

Figure 5B:
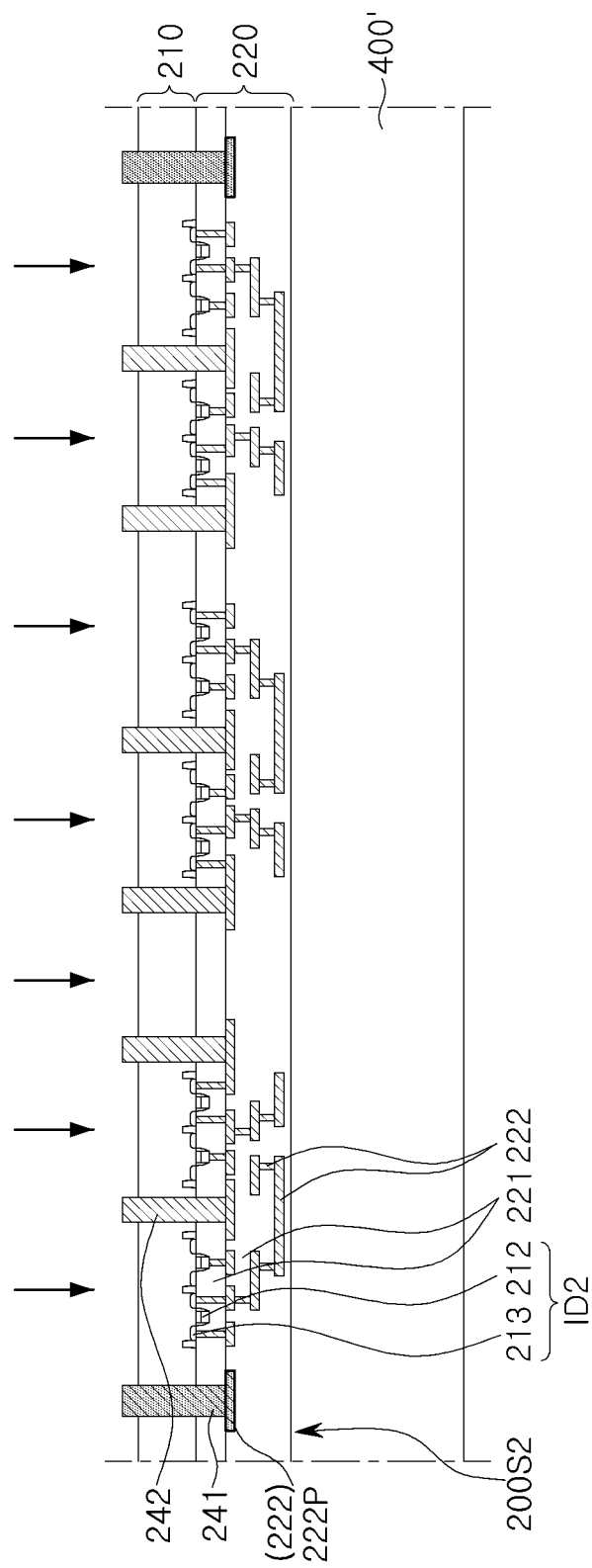

Referring to FIG. 5B, the second circuit layer 220 may be attached to a dummy semiconductor 400', and a portion of the second substrate layer 210' of FIG. 5A may be removed to expose a portion of the second through vias 241 and 242. The dummy semiconductor 400' may be a silicon wafer before dicing. The second substrate layer 210' of FIG. 5A may be removed using a chemical mechanical polishing (CMP) process, an etch-back process, or a combination thereof. One end of the second through vias 241 and 242 may protrude from the second substrate layer 210.

Figure 5C:
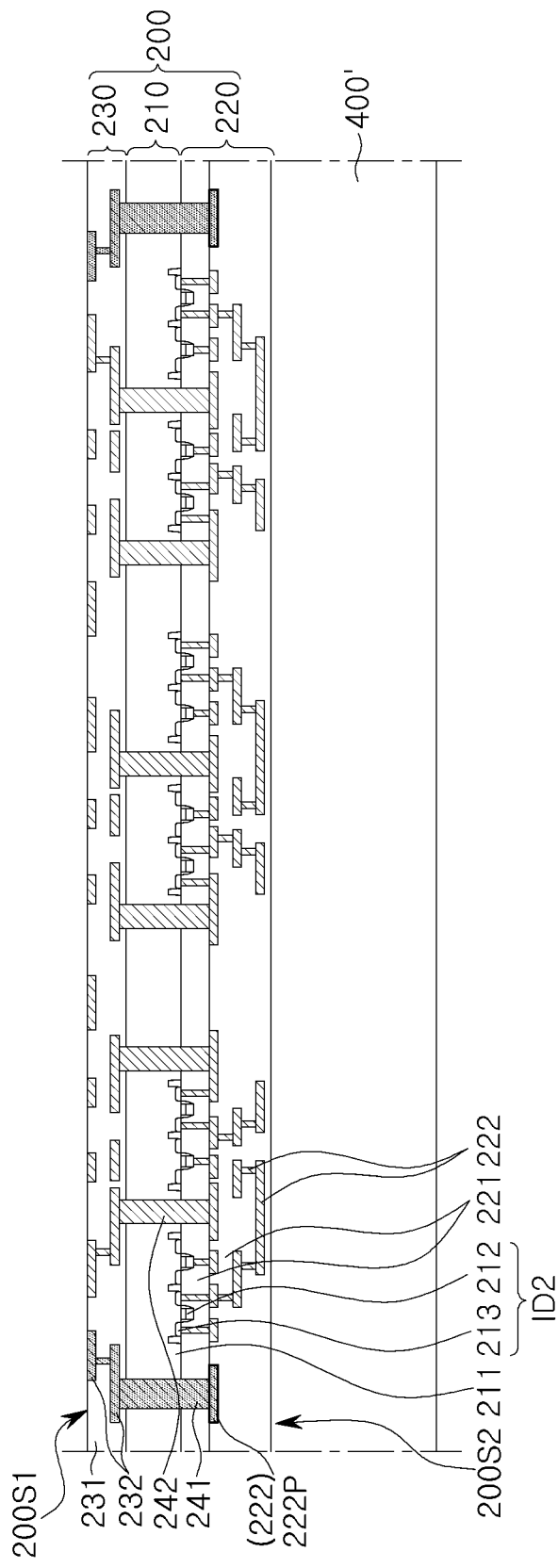

Referring to FIG. 5C, a second wiring layer 230 may be formed on the second substrate layer 210. The second wiring layer 230 may include a second rear interlayer insulating layer 231 and a second wiring structure 232. The second rear interlayer insulating layer 231 may include or may be formed of a silicon oxide film. The second wiring structure 232 may include multilayer wiring lines and wiring vias. A passivation film covering a portion of the second wiring structure 232 (e.g., a connection pad) may be disposed on the second rear surface 200S1 of the second semiconductor chip 200

Figure 5D:
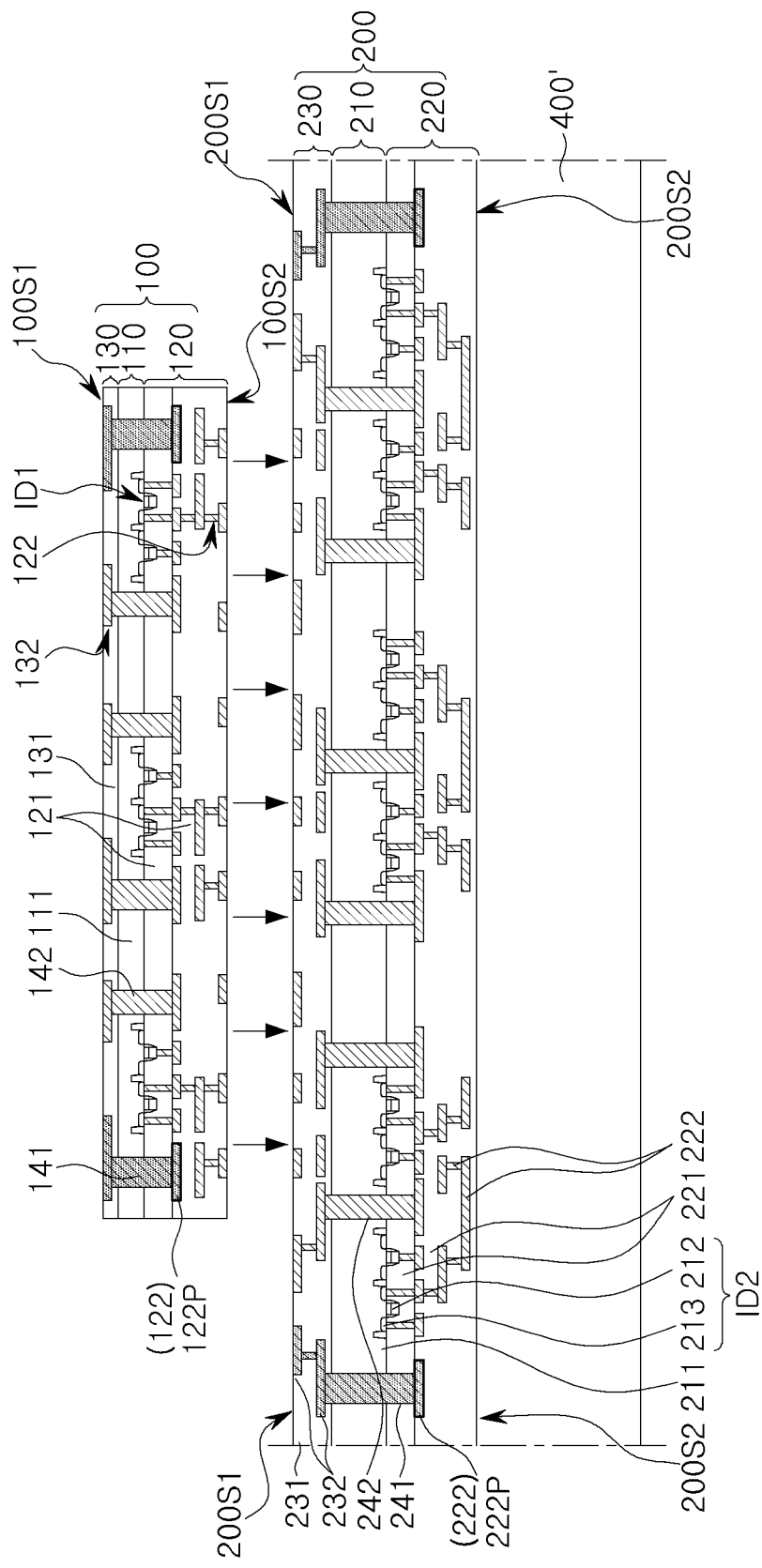

Referring to FIG. 5D, the diced first semiconductor chip 100 may be attached to the second rear surface 200S1 of the second semiconductor chip 200 in a wafer state. The first semiconductor chip 100 may be disposed so that the first forward surface 100S2 faces the second rear surface 200S1. The first semiconductor chip 100 may be directly coupled to the second semiconductor chip 200 without a separate adhesive member or a connection member. For example, the second rear interlayer insulating layer 231 and the first interlayer insulating layer 121 may be compressed and coupled to each other, and then heated to couple a second wiring structure 232 and a first circuit structure 122 in contact with each other. For example, the second wiring structure 232 and the first circuit structure 122 may include or may be formed of copper (Cu), and may be connected with each other via a Cu-to-Cu direct bonding.

Figure 5E:
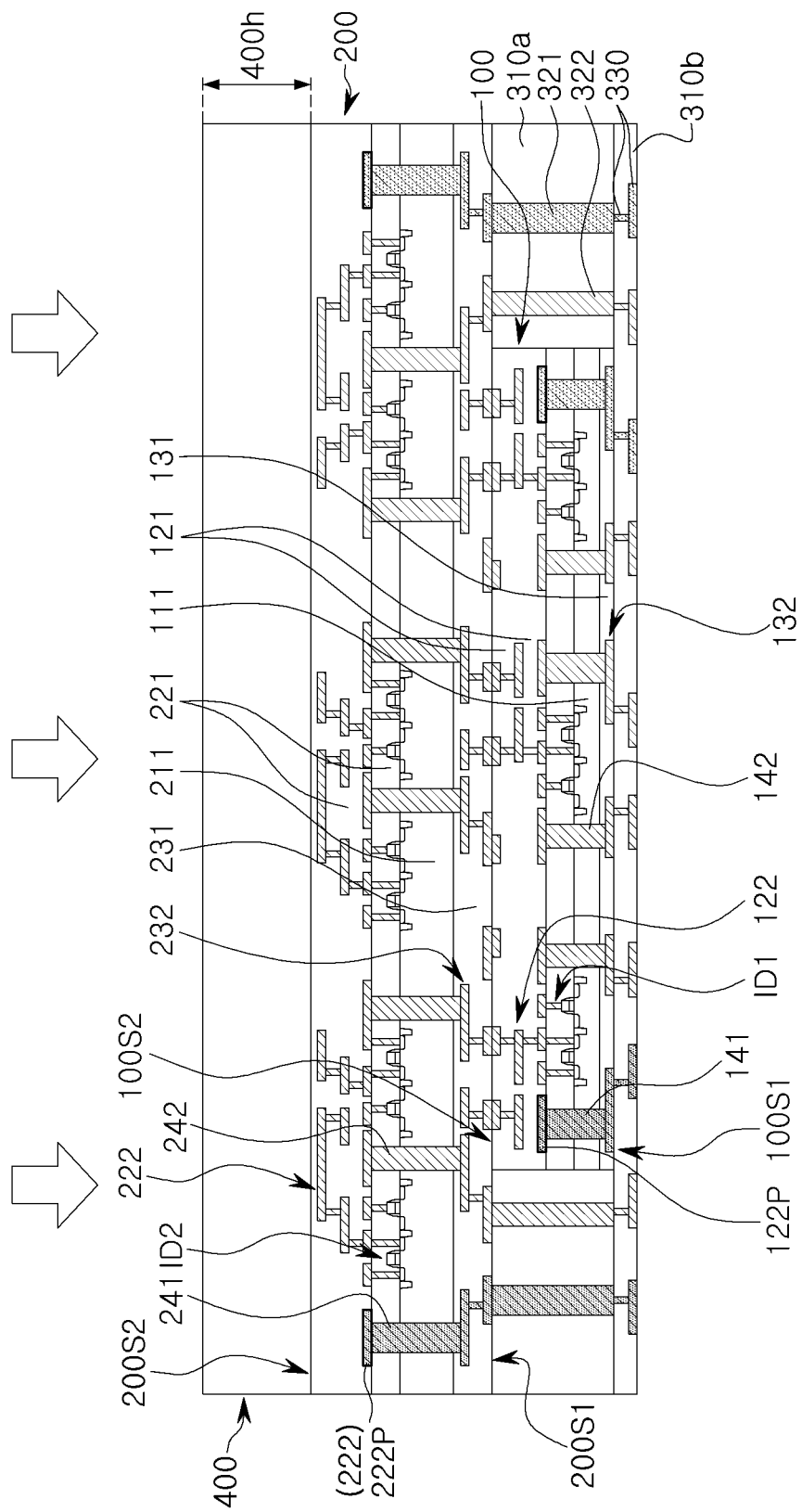

Referring to FIG. 5E, first and second encapsulation layers 310a and 310b encapsulating the first semiconductor chip 100, third through vias 321 and 322, and a redistribution structure 330 (i.e., a lower redistribution layer) may be formed, and then, an upper portion of a dummy semiconductor chip 400 may be partially removed to have a desired thickness 400h. The first and second encapsulation layers 310a and 310b may be formed by applying and curing a polymer. The third through vias 321 and 322 and the redistribution structure 330 may be formed by performing a photolithography process, a plating process, or the like. A portion of the dummy semiconductor chip 400 may be removed by a CHIP process, an etch-back process or a combination thereof. Before the dummy semiconductor chip 400 is polished, the second semiconductor chip 200 in a wafer state may be diced, or after the dummy semiconductor chip 400 is polished, a dicing process may be performed. Thereafter, a connection bump may be formed on the exposed redistribution structure 330 to complete a semiconductor package.

Figure 6A:
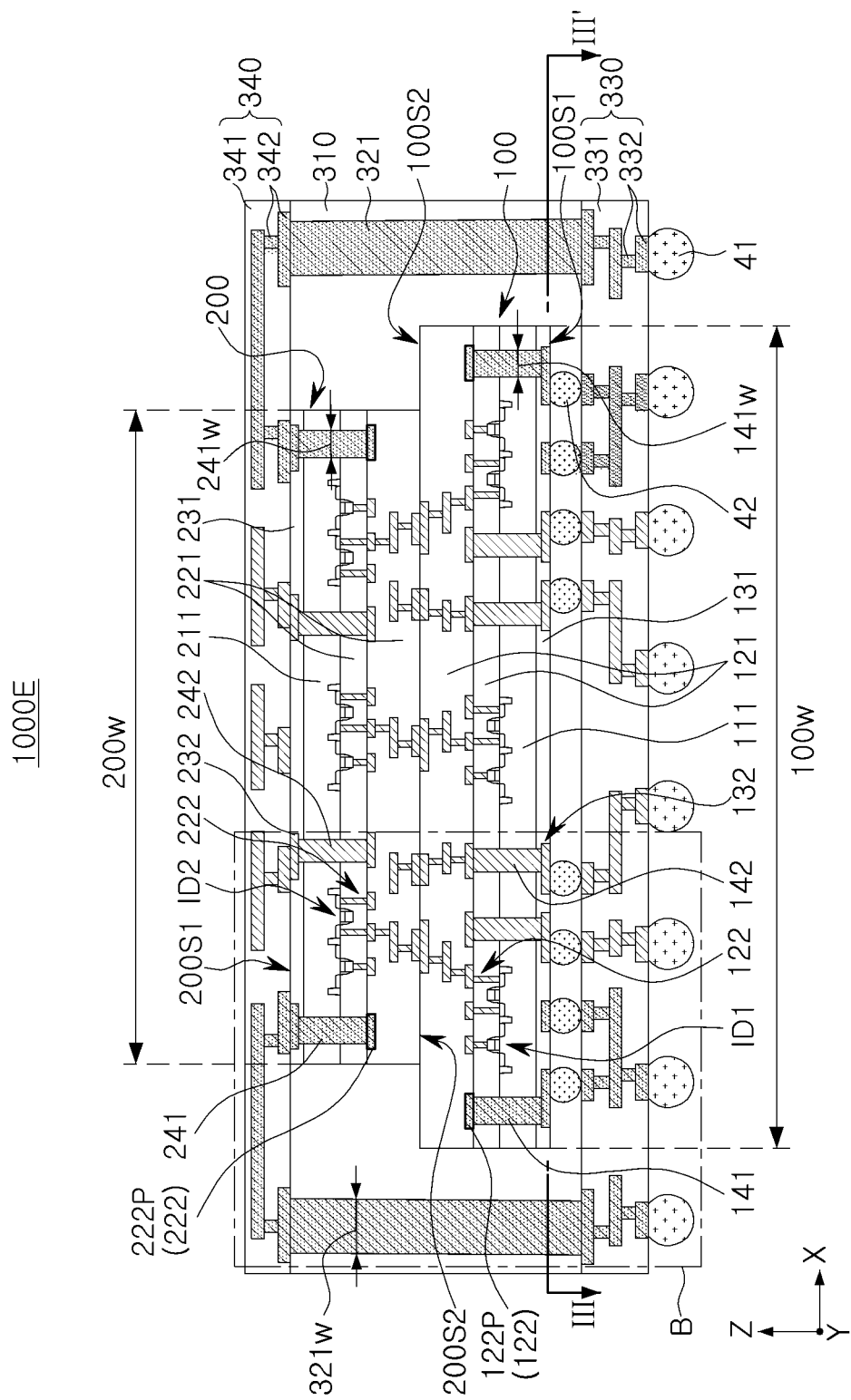
FIGS. 6A to 6D are diagrams illustrating a semiconductor package according to an example embodiment of the present inventive concept.
Figure 6B:
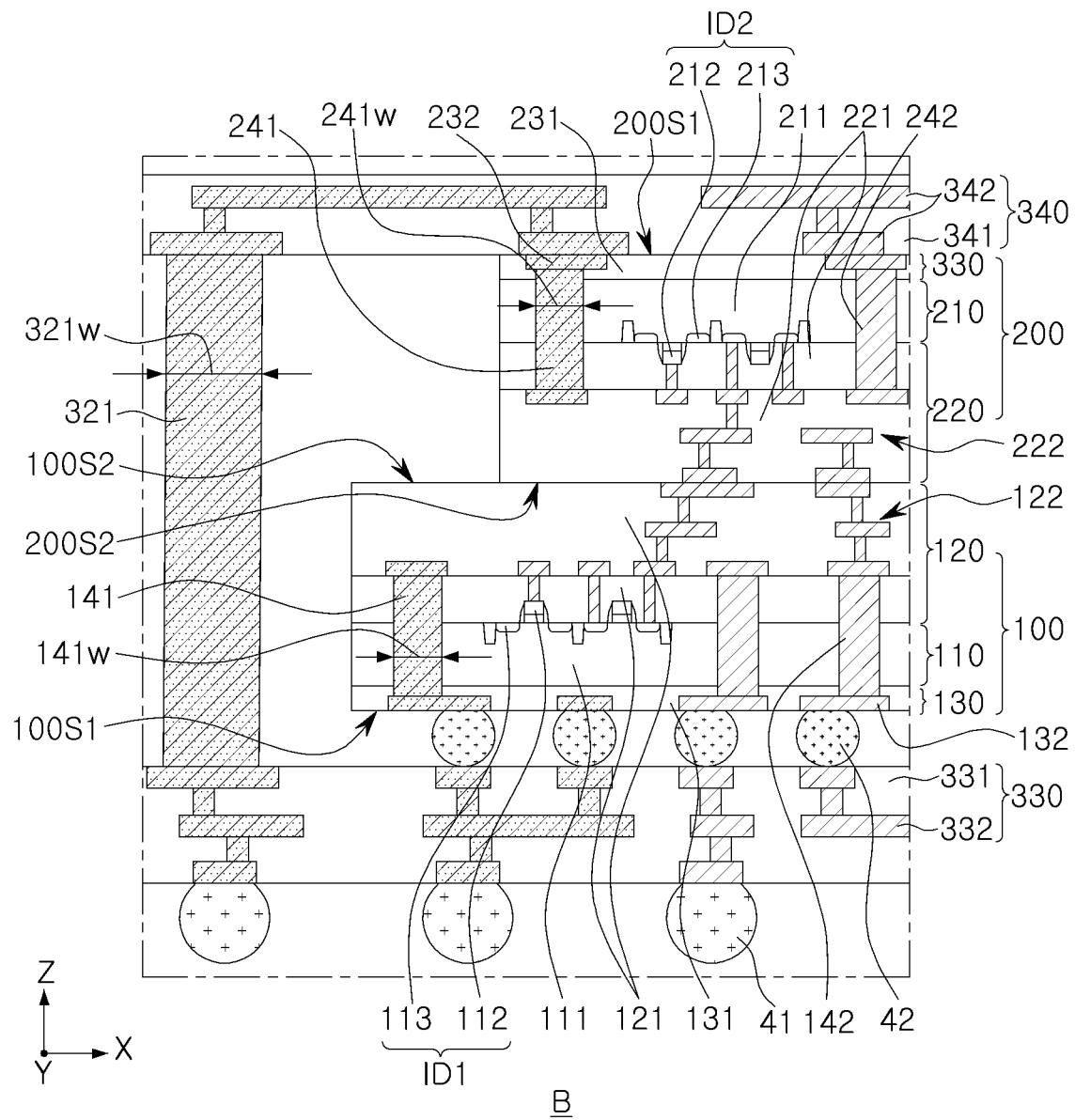
Figure 6C:
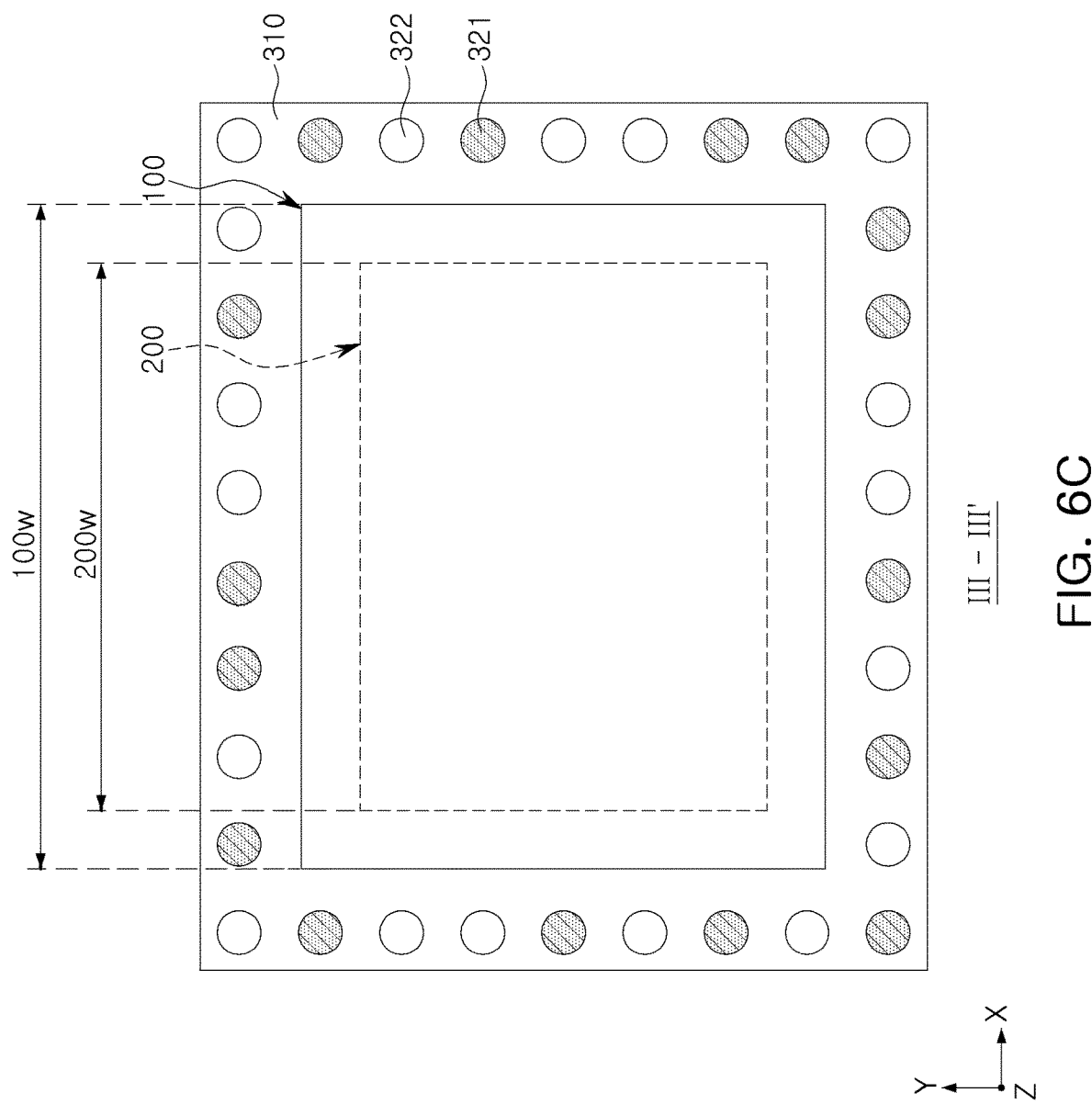
Figure 6D:
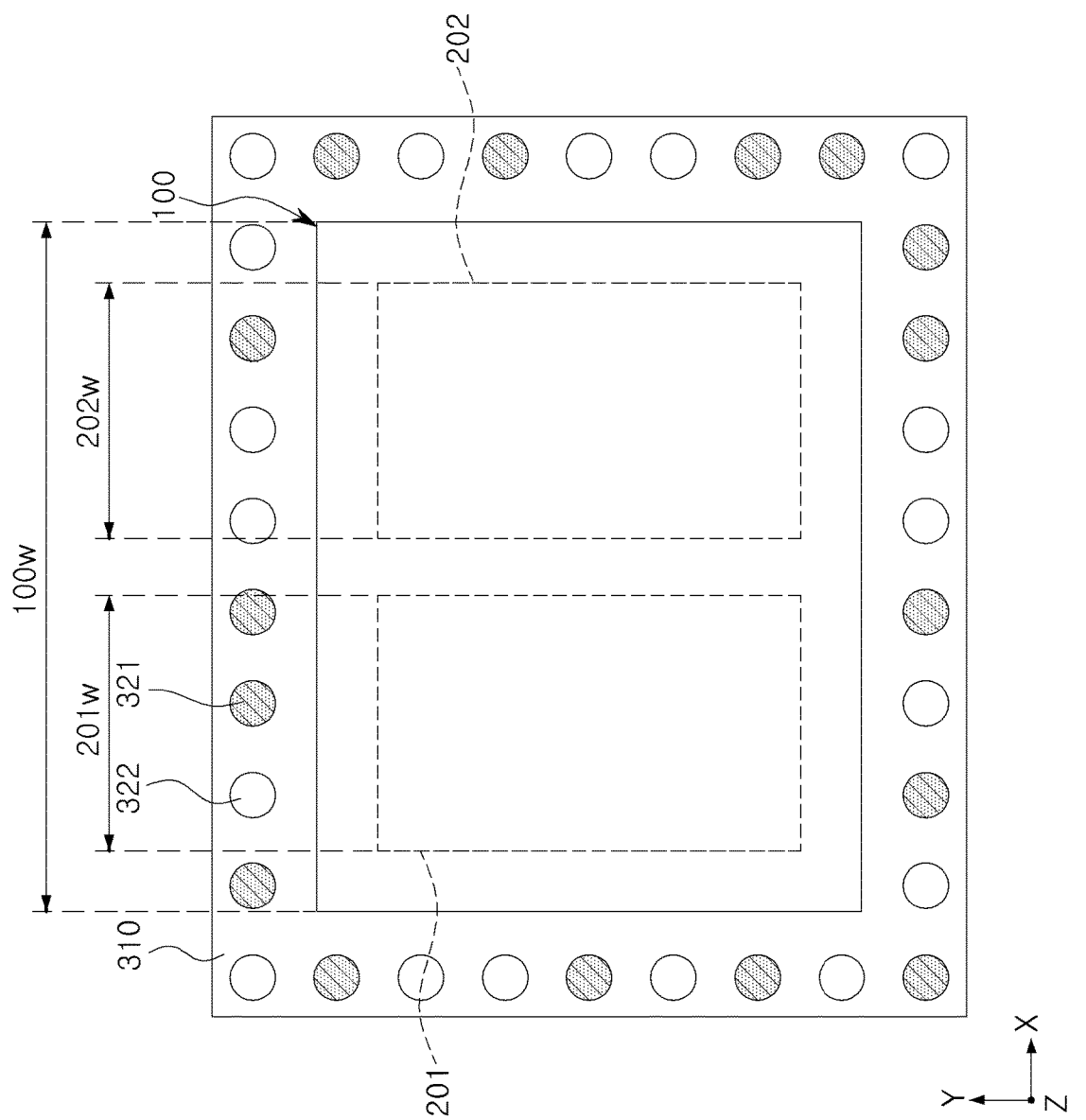

FIGS. 6A to 6D are diagrams illustrating a semiconductor package 1000E according to an example embodiment of the present inventive concept. FIG. 6A is a cross-sectional diagram schematically illustrating a vertical cross-section of the semiconductor package 1000E, FIG. 6B is an enlarged diagram of a region "B" of FIG. 6A, and FIG. 6C is a plan diagram illustrating a cross-section taken along line of FIG. 6A. In FIG. 6C, some components included in the first and second semiconductor chips 100 and 200 are omitted. FIG. 6D is a plan diagram illustrating an example in which a plurality of second semiconductor chips 201 and 202 are provided.

Referring to FIGS. 6A to 6C, in the semiconductor package 1000E, first and second semiconductor chips 100 and 200 are stacked such that the second forward surface 200S2 of the second semiconductor chip 200 faces the first forward surface 100S2, and the semiconductor package 1000E may include an encapsulation layer 310, third through vias 321 and 322, a lower redistribution layer 330, and an upper redistribution layer 340. An internal connection bump 42 may be disposed between the first semiconductor chip 100 and the lower redistribution layer 330, and an external connection bump 41 may be disposed on a lower surface of the lower redistribution layer 330. Since the first and second semiconductor chips 100 and 200 have the same or similar characteristics as those described above, overlapping descriptions thereof are omitted.

In an example embodiment, a ratio of a planar area of the first semiconductor chip 100 to a planar area of the second semiconductor chip 200 may be 2:1 or less or 1:2 or less. For example, a ratio of the planar area of the first semiconductor chip 100 to the planar area of the second semiconductor chip 200 may be in a range of 2:1 to 1:2. Accordingly, the first and second semiconductor chips 100 and 200 may be disposed such that the respective rear surfaces 100S1 and 200S1 face outwardly, and the second semiconductor chip 200 may be connected to a third through via for power 321 through the upper redistribution layer 340. In the drawings, the width 100w of the first semiconductor chip 100 is shown to be greater than the width 200w of the second semiconductor chip 200, but is not limited thereto, and it may have widths of various sizes within the above-described planar ratio.

The encapsulation layer 310 may cover at least a portion of each of a side surface of the first semiconductor chip 100 and a side surface of the second semiconductor chip 200. The encapsulation layer 310 may include or may be formed of, for example, a thermosetting resin such as an epoxy resin, a thermoplastic resin such as polyimide, or a prepreg including an inorganic filler or/and glass fiber, an Ajinomoto Build-up Film (ABF), FR-4, Bismaleimide Triazine (BT), an epoxy molding compound (EMC), or a photo-imageable dielectric (PID) resin.

The third through vias 321 and 322 may penetrate through the encapsulation layer 310 and may be disposed adjacent to a side surface of the first semiconductor chip 100 and a side surface of the second semiconductor chip 200. The third through vias 321 and 322 may include a third through via for power 321 and a third signal through via 322. The third through vias 321 and 322 may be metal posts formed in a semiconductor package process. Accordingly, the widths of the third through vias 321 and 322 may be greater than the widths of the first and second through vias 141, 142, 241 and 242. For example, a width 321w of the third through via for power 321 may be greater than each of the width 142w of the first through via for power 141 and the width 241w of the second through via for power 241. The third through vias 321 and 322 may include a metal material including, for example, copper (Cu), aluminum (Al), silver (Ag), tin (Sn), gold (Au), nickel (Ni), lead (Pb), titanium (Ti), or an alloy thereof. The second semiconductor chip 200 may receive power through the third through via for power 321, the upper redistribution structure 342, the second wiring structure 232, and the second through via for power 241. Accordingly, a degree of congestion of the second circuit layer 220 may be reduced, such that a connection path between the first and second semiconductor chips 100 and 200 may be shortened, and problems such as a voltage drop may be solved.

The lower redistribution layer 330 and the upper redistribution layer 340 may be disposed on the lower surface and the upper surface of the encapsulation layer 310, respectively. The lower redistribution layer 330 and the upper redistribution layer 340 may include insulating layers 331 and 341 and redistribution structures 332 and 342, respectively. The insulating layers 331 and 341 may include or may be formed of, for example, a PID resin. The redistribution structures 332 and 342 may include or may be formed of a metal material such as copper, and may be formed by a photolithography process and a plating process. The lower redistribution structure 332 may connect each of the third through vias 321 and 322 to a corresponding one of external connection bumps 41, and each of the first through via for power and the first through via for the signal 141 and 142 to a corresponding one of the external connection bumps 41. The upper redistribution structure 342 may connect the third through via for power 321 and the second through via for power 241 with each other.

According to an embodiment of the present inventive concept, the semiconductor package 1000E may include a lower redistribution layer 330 provided with the external connection bumps 41 including a plurality of power bumps at a lower surface of the lower redistribution wiring layer, and a first semiconductor chip 100 including a first substrate layer 110 (i.e., a first substrate). The first substrate layer 110 may be disposed on an upper surface of the lower redistribution layer 330 and may have a first active surface and a first backside surface, the first semiconductor chip 100 including a plurality of first transistors ID1 which are formed at the first active surface of the first substrate. The first backside surface is opposite to the active surface, and adjacent to the upper surface of the lower redistribution layer 330. The first semiconductor chip 100 may further include a first circuit structure 122 (i.e., a plurality of first circuit wirings) connected to the plurality of first transistors ID1 and disposed on the first active surface of the first substrate layer 110. The semiconductor package 1000E may further include a second semiconductor chip 200 including a second substrate layer 210 (i.e., a second substrate) which has a second active surface and a second backside surface. The second semiconductor chip 200 may include a plurality of second transistors ID2 which are formed at the second active surface of the second substrate layer 210. The second substrate layer 210 may be stacked on the first substrate layer 110 such that the first active surface and the second active surface are disposed between the first backside surface and the second backside surface. The second semiconductor chip 200 may further include a second circuit layer 220 (i.e., a plurality of second circuit wirings) connected to the plurality of second transistors ID2 and disposed on the second active surface. The semiconductor package 1000E may further include an upper redistribution layer 340, a first through via for power 141, a second through via for power 241, and a third through via for power 321. The first through via for power 141 may be electrically connected to a corresponding one of the plurality of power bumps and penetrate the first substrate layer 110 to provide a first power to the plurality of first transistors ID1. The second through via for power 241 may penetrate the second substrate layer 210. The upper redistribution layer 340 may be disposed on the second backside surface of the second substrate layer 210. The third through via for power 321 may extend from the upper surface of the lower redistribution layer 330 to a lower surface of the upper redistribution layer 340. The third through via 321 may be electrically connected to a corresponding one of the plurality of power bumps through the lower redistribution layer 330 and the second through via for power 241 through the upper redistribution layer 340 to provide a second power to the plurality of second transistors ID2. In an embodiment, the first power and the second power are the same as each other. The present inventive concept is not limited thereto. For example, the first power and the second power may be different from each other. The power level of the first power may be higher or lower than that of the second power.

Referring to FIG. 6D, in an example, at least one of the first semiconductor chip 100 and the second semiconductor chip 200 may be provided as a plurality of semiconductor chips spaced apart from each other. For example, the first semiconductor chip 100 has a width 100w, greater than each of a width 201w of a 2-1 semiconductor chip 201 and a width 202w of a 2-2 semiconductor chip 202. The second semiconductor chips 201 and 202 may be provided as a plurality of semiconductor chips 201 and 202 disposed on the first forward surface 100S2 of the first semiconductor chip 100. The 2-1 semiconductor chip 201 and the 2-2 semiconductor chip 202 may be spaced apart from each other in a parallel direction (X-axis direction). A sum of the width 201w of the 2-1 semiconductor chip 201 and the width 202w of the 2-2 semiconductor chip 202 in the parallel direction (X-axis direction) may be narrower than the width 100w of the first semiconductor chip 100. Since the first semiconductor chip 100 and the 2-1 and 2-2 semiconductor chips 201 and 202 have the same or similar characteristics as the 1-1 and 1-2 semiconductor chips 101 and 102 and the second semiconductor chip 200 described in FIGS. 3A and 3B, overlapping descriptions thereof will be omitted.

Figure 7:
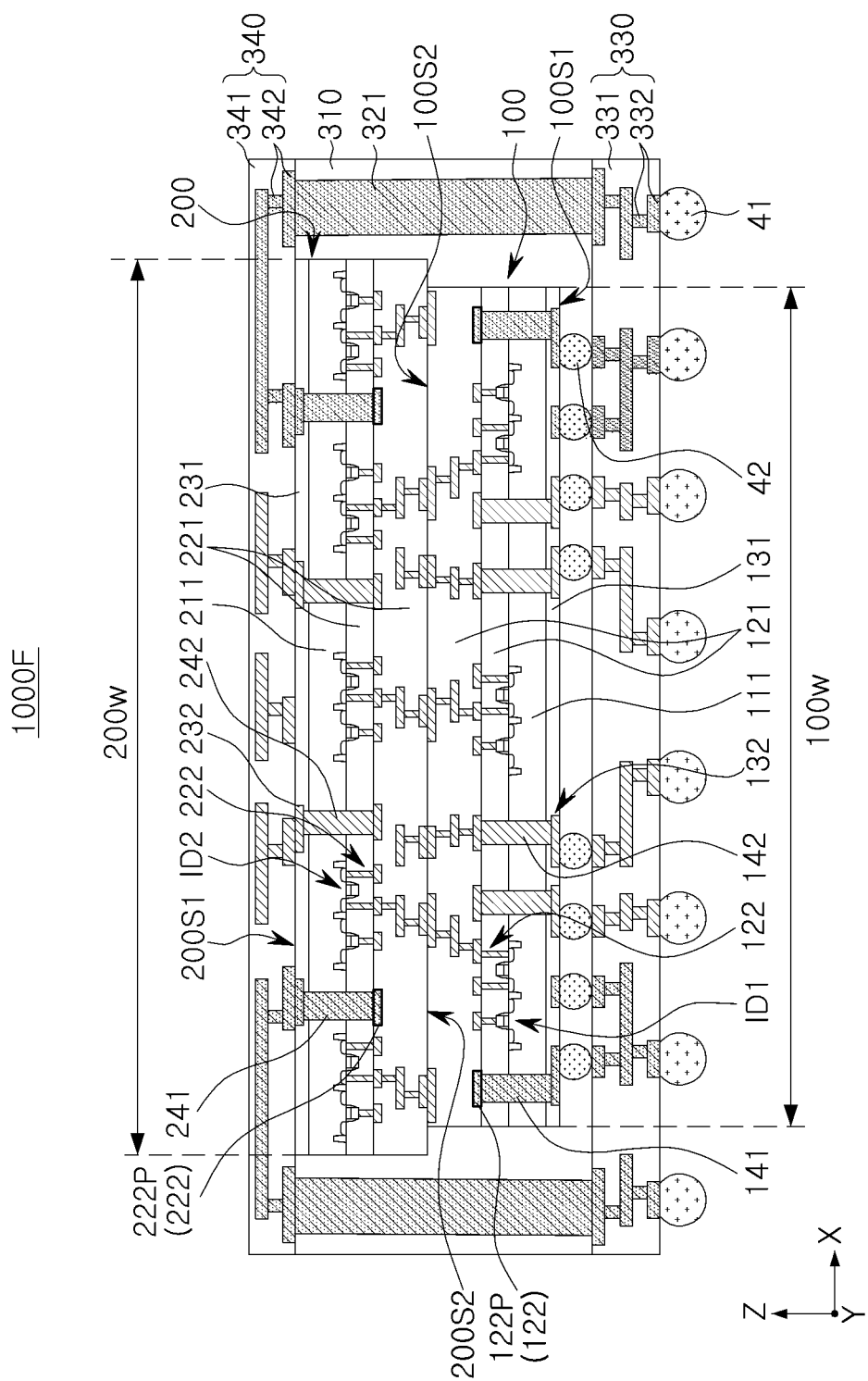
FIG. 7 is a diagram illustrating a semiconductor package according to an example embodiment of the present inventive concept.

FIG. 7 is a diagram illustrating a semiconductor package 1000F according to an example embodiment of the present inventive concept. FIG. 7 is a cross-sectional diagram illustrating a vertical cross-section of the semiconductor package 1000F.

Referring to FIG. 7, unlike FIG. 6A, in the semiconductor package 1000F, a width 100w of the first semiconductor chip 100 may be narrower than a width 200w of the second semiconductor chip 200. As described above, the first and second semiconductor chips 100 and 200 may be combined with each other to form integrated circuits. According to the design, when a ratio of planar areas of the first and second semiconductor chips 100 and 200 is in a range of 1:2 to 2:1, the first and second semiconductor chips 100 and 200 may be disposed as in FIG. 6A or 7. It may be appropriately selected in consideration of a path to the internal connection bump 42, a connection path between the first and second semiconductor chips 100 and 200, and the like.

Figure 8:
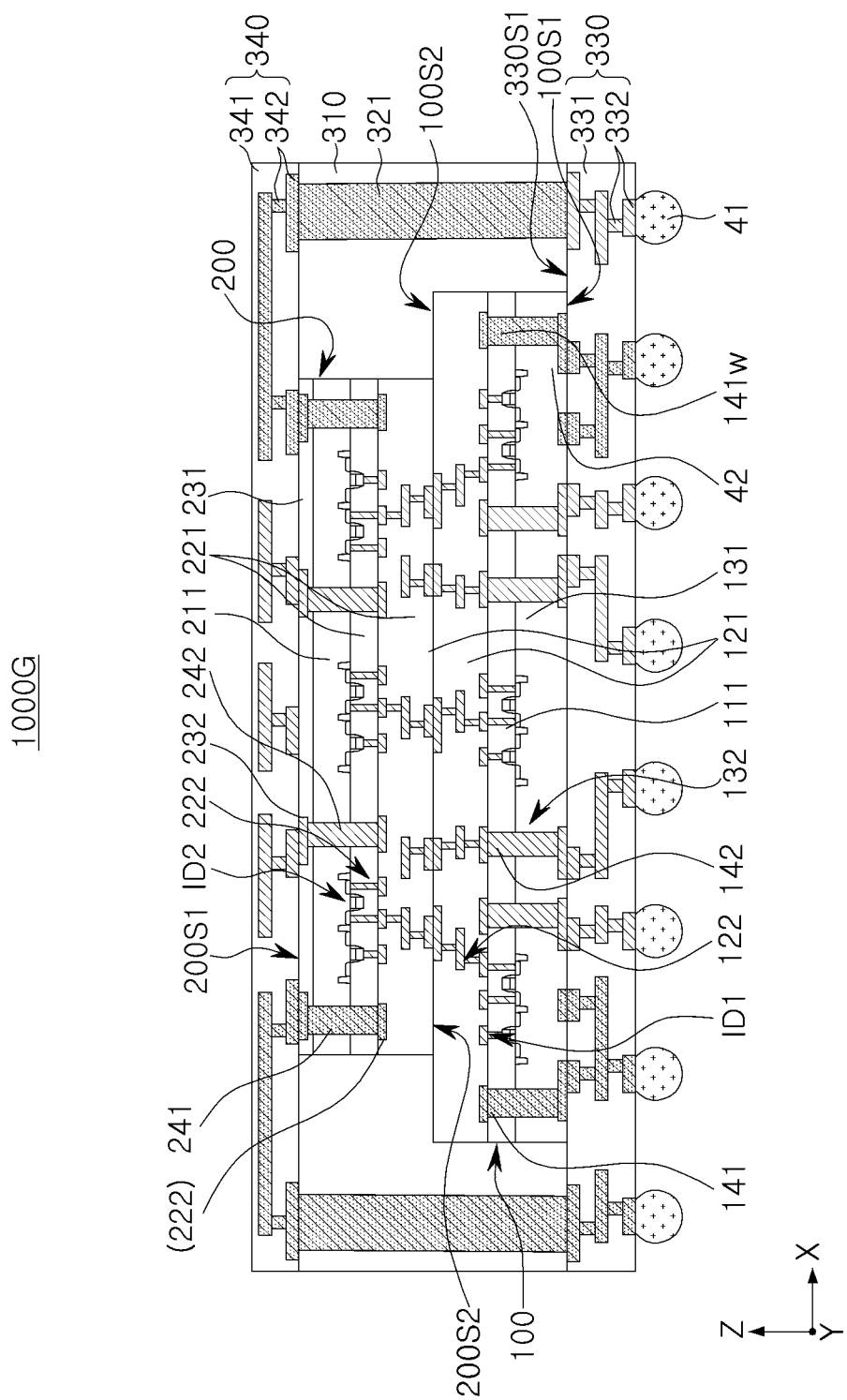
FIG. 8 is a diagram illustrating a semiconductor package according to an example embodiment of the present inventive concept.

FIG. 8 is a diagram illustrating a semiconductor package 1000G according to an example embodiment of the present inventive concept. FIG. 8 is a diagram illustrating a vertical cross-section of the semiconductor package 1000G.

Referring to FIG. 8, the semiconductor package 1000G does not include an internal connection bump ("42" in FIG. 6A) between a first semiconductor chip 100 and a lower redistribution layer 330. The first semiconductor chip 100 may contact an upper surface of a lower redistribution layer 330. Without the internal connection bump, the semiconductor package 1000G may have a reduced thickness and a shortened electrical path in the package. In an example, the lower redistribution layer 330 may be directly formed on the first rear surface 100S1 of the first semiconductor chip 100 provided with the encapsulation layer 310 and the third through via 321.

Figure 9:
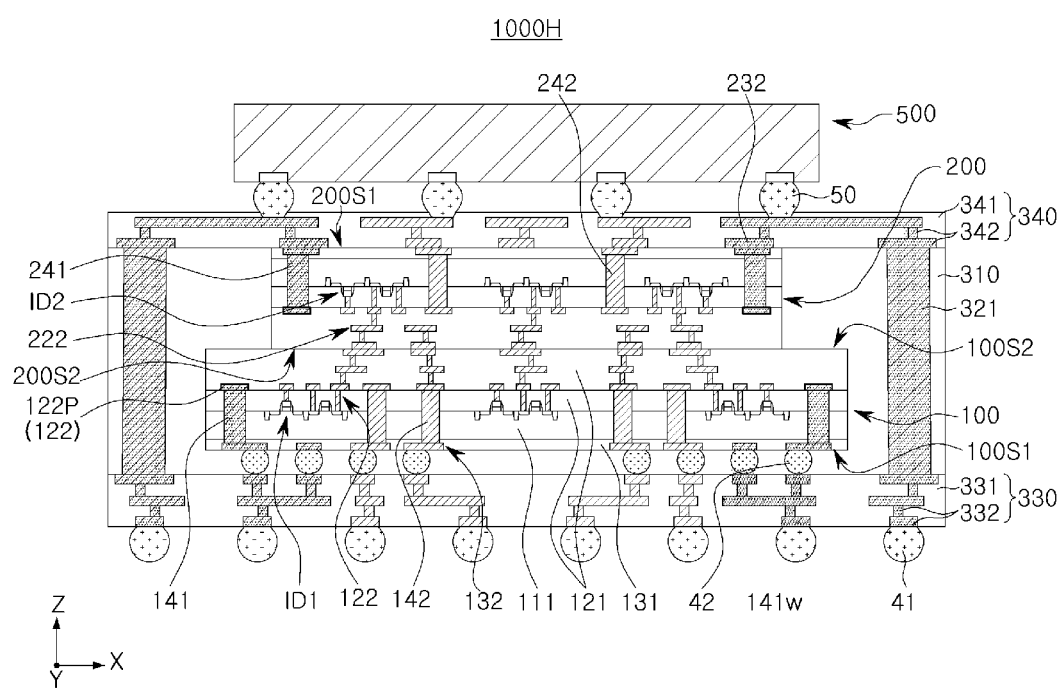
FIG. 9 is a diagram illustrating a semiconductor package according to an example embodiment of the present inventive concept.

FIG. 9 is a diagram illustrating a semiconductor package 1000H according to an example embodiment of the present inventive concept. FIG. 9 is a cross-sectional diagram illustrating a vertical cross-section of the semiconductor package 1000H.

Referring to FIG. 9, the semiconductor package 1000H may further include an upper semiconductor structure 500 disposed on the upper redistribution layer 340. The upper semiconductor structure 500 may be electrically connected to an upper redistribution structure 342 through a connection bump 50 disposed in an opening of an upper insulating layer 341. The upper semiconductor structure 500 may include a logic chip such as a central processor (CPU), a graphics processor (GPU), a field programmable gate array (FPGA), a digital signal processing device (DSP), an image signal processing device (ISP), an encryption processor, a microprocessor, a microcontroller, an analog-digital converter, an application-specific IC (ASIC), or a memory chip such as a volatile memory chip such as DRAM or SRAM, a nonvolatile memory chip such as PRAM, MRAM, RRAM, and a flash memory, or a sensor chip such as a CMOS Image Sensor (CIS). The upper semiconductor structure 500 may be a semiconductor package including the above-described semiconductor chip.

FIGS. 10A to 10D are diagrams schematically illustrating a method of manufacturing the semiconductor package 1000E of FIG. 6A.

Figure 10A:
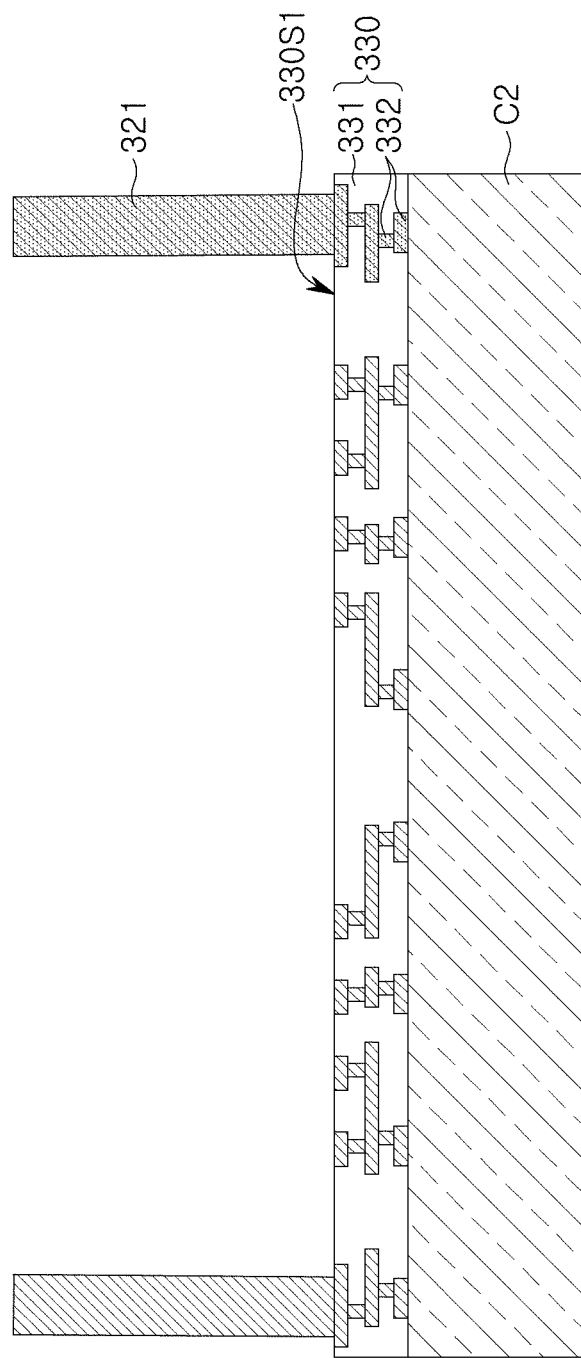
FIGS. 10A to 10D are diagrams schematically illustrating a method of manufacturing the semiconductor package of FIG. 6A.

Referring to FIG. 10A, after a lower redistribution layer 330 is disposed on the carrier C2, a third through via 321 connected to the lower redistribution structure 332 may be formed. The lower redistribution layer 330 may include an insulating layer 331 and a redistribution structure 332. The lower insulating layer 331 may include or may be formed of a photosensitive resin. After the insulating layer 331 is formed, a redistribution pattern and a via pattern may be formed by a photolithography process, an etching process, or the like, and the redistribution structure 332 may be formed by a plating process. A third through via for power 321 may be formed by a plating process.

Figure 10B:
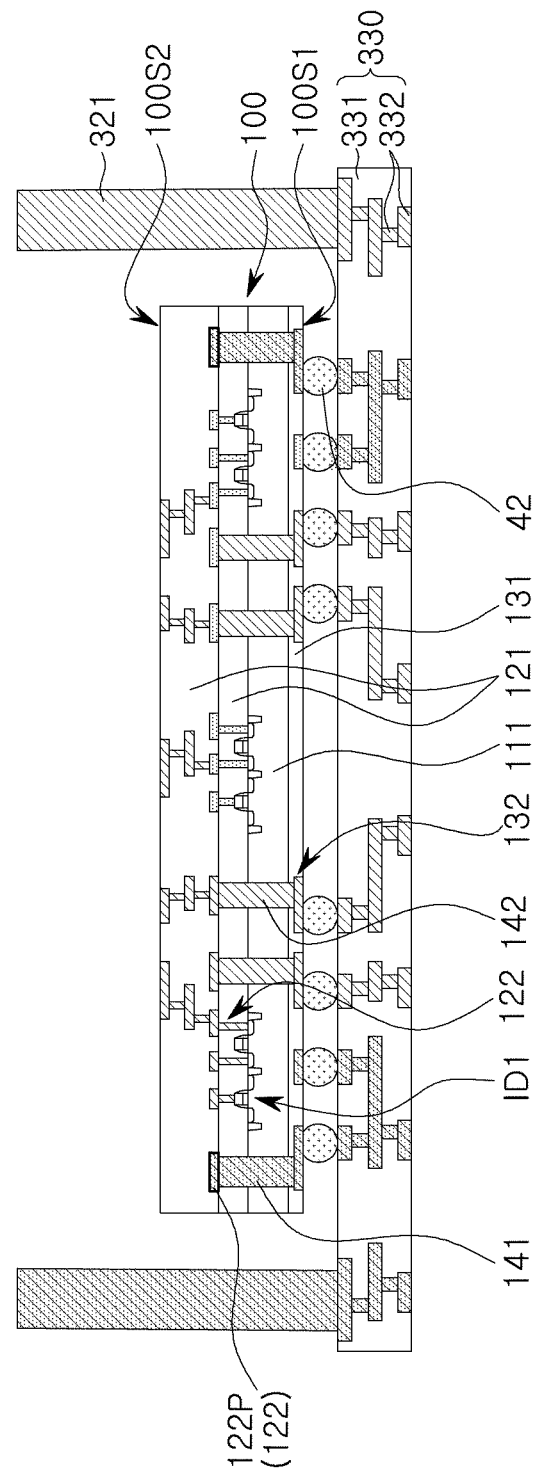

Referring to FIG. 10B, a first semiconductor chip 100 may be mounted on the lower redistribution layer 330. The first semiconductor chip 100 may be disposed in a face-up form such that a first rear surface 10051 faces or is adjacent to the lower redistribution layer 330. The first semiconductor chip 100 may be mounted on the lower redistribution layer 330 in a flip-chip manner. The first semiconductor chip 100 may be electrically connected to the lower redistribution structure 332 by an internal connection bump 42. An underfill resin surrounding the internal connection bump 42 may be disposed between the first semiconductor chip 100 and the lower redistribution layer 330.

Figure 10C:
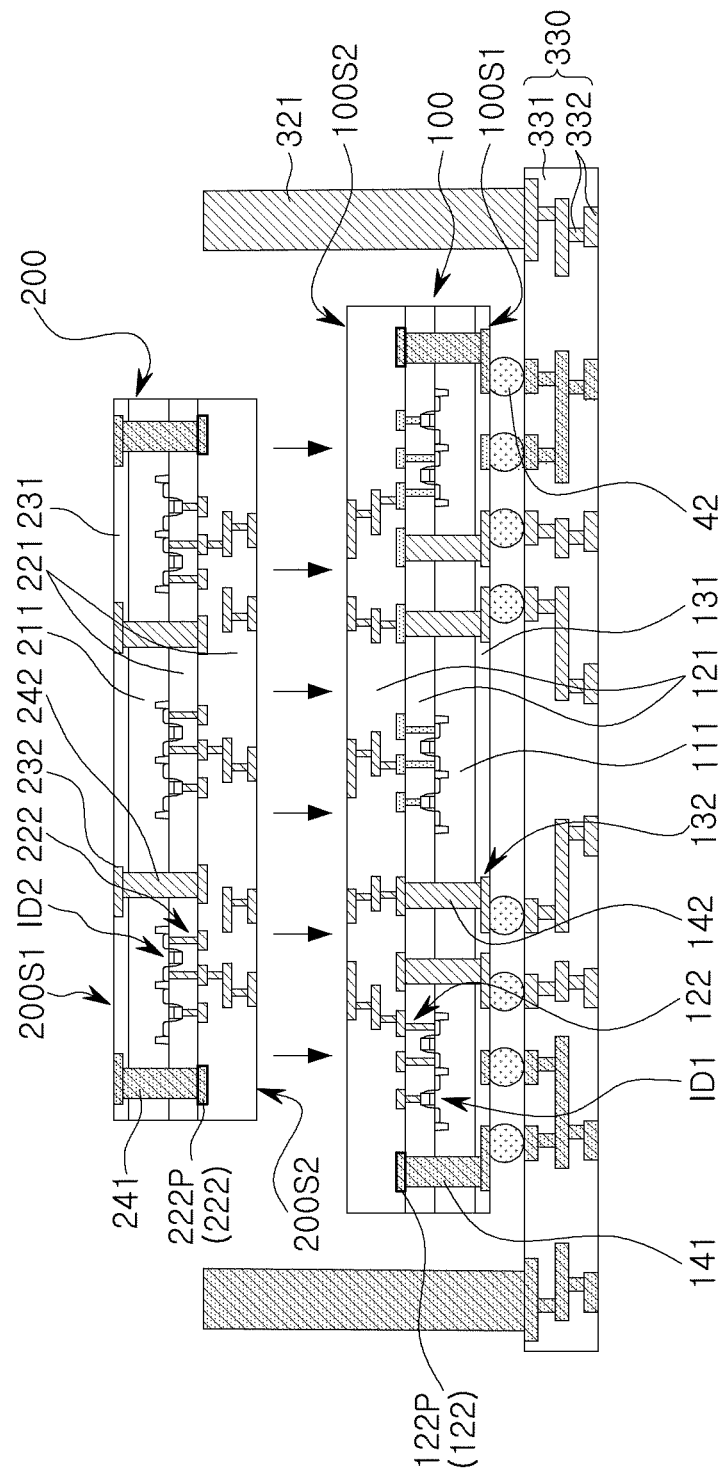

Referring to FIG. 10C, a second semiconductor chip 200 may be disposed on a first forward surface 100S2 of the first semiconductor chip 100. The second semiconductor chip 200 may be disposed so that a second forward surface 200S2 faces the first forward surface 100S2. The second semiconductor chip 200 may be attached to the first forward surface 100S2 of the first semiconductor chip 100 without a separate connection member (e.g., solder bump, copper pillar, etc.). For example, a second interlayer insulating layer 221 and a first interlayer insulating layer may be compressed and coupled to each other, and then heated to couple a second circuit structure 222 and a first circuit structure 122 in contact with each other.

Figure 10D:
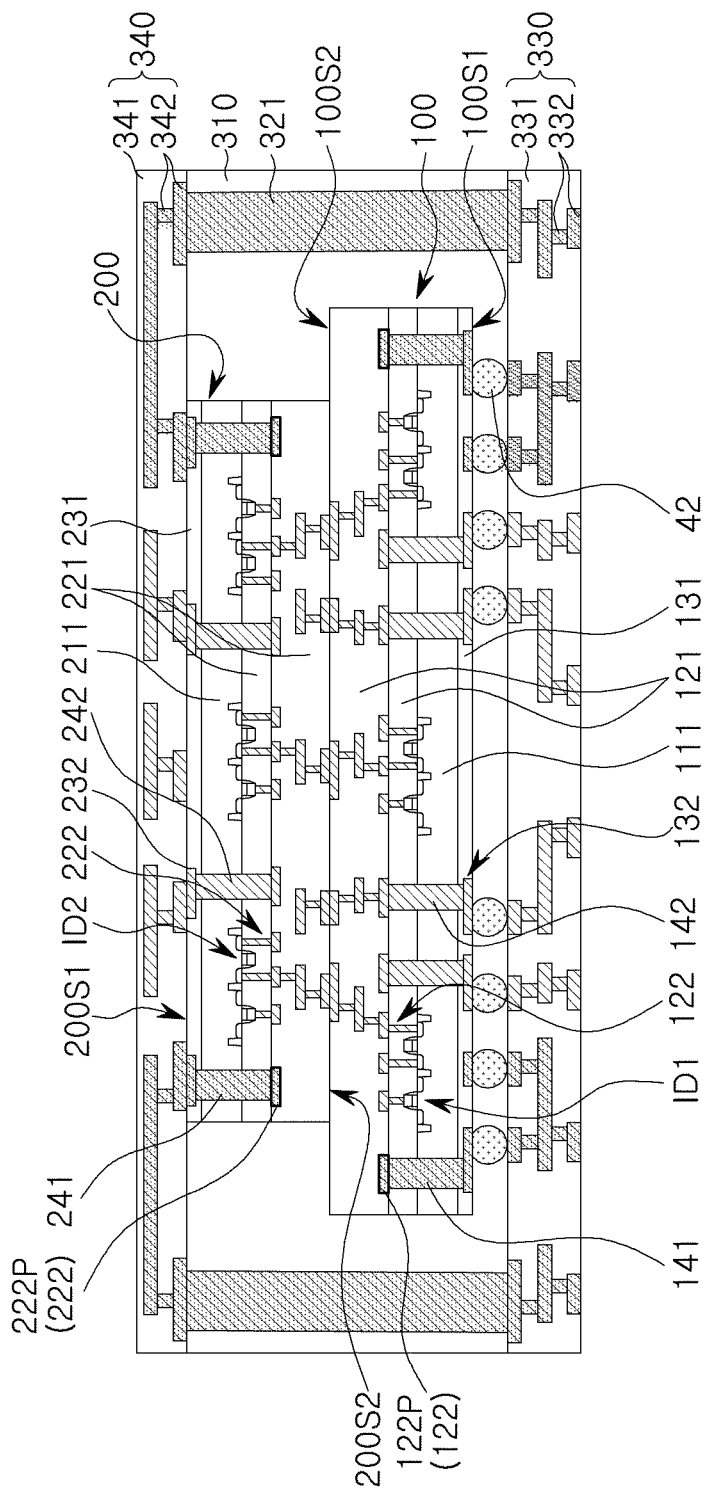

Referring to FIG. 10D, an encapsulation layer 310 for sealing first and second semiconductor chips 100 and 200 and a third through via 321, and an upper redistribution layer 340, disposed on the encapsulation layer 310, may be formed. The encapsulation layer 310 may include or may be formed of a molding material such as EMC or ABF. In FIG. 10D, the encapsulation layer 310 is not interposed between the second semiconductor chip 200 and the upper redistribution layer 340. The present inventive concept is not limited thereto. For example, the encapsulation layer 310 may be interposed between the second semiconductor chip 200 and the upper redistribution layer 340. The upper redistribution structure 342 may further include redistribution vias penetrating through the encapsulation layer 310 interposed between the second semiconductor chip 200 and the upper redistribution layer 340. The upper insulating layer 341 may include or may be formed of a photosensitive resin. The upper redistribution structure 342 may be formed by a photolithography process, or the like.

As set forth above, according to example embodiments of the present inventive concept, by supplying power to rear surfaces of a plurality of semiconductor chips stacked in a perpendicular direction, a semiconductor package in which a voltage drop is reduced, a switching time is shortened, and an occupied area is minimized may be provided.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. The term "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not refer to the same example embodiment, and is provided to emphasize a particular feature or characteristic different from that of another example embodiment. However, example embodiments provided herein are considered to be able to be implemented by being combined in whole or in part one with one another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than limiting the present disclosure. In this case, singular forms include plural forms unless interpreted otherwise in context.

While example embodiments have been shown and described above, it will be apparent to those skilled in the art that modifications and variations could be made without departing from the scope of the present inventive concept as defined by the appended claims.

What is claimed is:
1. A semiconductor package, comprising:
a first semiconductor chip having a first front surface and a first rear surface, opposite to the first front surface, including:
    a first circuit layer including a plurality of first individual devices and a first circuit wiring structure electrically connected to the plurality of first individual devices and providing the first front surface,
    a first wiring layer including a first wiring structure and providing the first rear surface,
    a first substrate layer disposed between the first circuit layer and the first wiring layer, and
    a first through via for power penetrating through the first substrate layer and electrically connecting the first circuit wiring structure and the first wiring structure with each other; and
a second semiconductor chip disposed on the first semiconductor chip, having a second front surface and a second rear surface, opposite to the second front surface, including:
    a second circuit layer including a plurality of second individual devices and a second circuit wiring structure electrically connected to the plurality of second individual devices and providing the second front surface,
    a second wiring layer including a second wiring structure and providing the second rear surface,
    a second substrate layer disposed between the second circuit layer and the second wiring layer, and
    a second through via for power penetrating through the second substrate layer and electrically connecting the second circuit wiring structure and the second wiring structure with each other,
wherein the first and second semiconductor chips have different widths in a direction, parallel to the first and second front surfaces,
wherein the first semiconductor chip receives power through the first wiring structure and the first through via for power, and
wherein the second semiconductor chip receives power through the second wiring structure and the second through via for power.

2. The semiconductor package of claim 1, further comprising:
- an encapsulation layer covering at least one of a side surface of the first semiconductor chip and a side surface of the second semiconductor chip; and
- a third through via for power penetrating through the encapsulation layer and electrically connected to the second wiring layer,
- wherein the second semiconductor chip receives power through the third through via for power.

3. The semiconductor package of claim 1,
- wherein the first semiconductor chip further comprises:
- a first through via for a signal penetrating through the first substrate layer and electrically connecting the first circuit wiring structure and the first wiring structure with each other,
- wherein the second semiconductor chip further comprises a second through via for a signal penetrating through the second substrate layer and electrically connecting the second circuit wiring structure and the second wiring structure with each other.

4. The semiconductor package of claim 3,
- wherein a width of each of the first through via for power and the second through via for power is equal to or greater than a width of each of the first and second through vias for the signals.

5. The semiconductor package of claim 1,
- wherein the first semiconductor chip and the second semiconductor chip are electrically connected to each other through the first circuit wiring structure and the second circuit wiring structure or the first circuit wiring structure and the second wiring structure.

6. The semiconductor package of claim 5,
- wherein the first circuit wiring structure is in contact with the second circuit wiring structure or the second wiring structure.

7. The semiconductor package of claim 1,
- wherein the first through via for power includes a first end which is disposed in the first wiring layer, and a second end which is located opposite to the first end and is disposed in the first circuit layer or the first substrate layer,
- wherein the second through via for power includes a first end which is disposed in the second wiring layer, and a second end which is disposed opposite to the first end and is disposed in the second circuit layer or the second substrate layer.

8. The semiconductor package of claim 1,
- wherein the plurality of first individual devices and the first circuit wiring structure provide a first integrated circuit,
- wherein the plurality of second individual devices and the second circuit wiring structure provide a second integrated circuit, and
- wherein the first and second integrated circuits comprise at least one of a logic circuit, an input/output circuit, an analog circuit, a memory circuit, and a series-to-parallel conversion circuit.

9. The semiconductor package of claim 8,
- wherein the logic circuit comprises at least one of a central processing unit (CPU), a graphic processing unit (GPU), a field programmable gate array (FPGA), a digital signal processing unit (DSP), an image signal processing unit (ISP), an encryption processor, a microprocessor, and a microprocessor, an analog-to-digital converter, and an application specific integrated circuit (ASIC).

10. A semiconductor package, comprising:
- a first semiconductor chip having a first front surface and a first rear surface, opposite to the first front surface, including:
  - a first substrate layer disposed between the first front surface and the first rear surface,
  - a first circuit layer including a first circuit wiring structure and providing the first front surface and disposed on the first substrate layer, and
  - a first through via for power penetrating through the first substrate layer and electrically connected to the first circuit wiring structure;
- a second semiconductor chip having a second front surface and a second rear surface, opposite to the second front surface, including:
  - a second substrate layer disposed between the second front surface and the second rear surface,
  - a second circuit layer including a second circuit wiring structure and providing the second front surface and disposed on the second substrate layer, and
  - a second through via for power penetrating through the second substrate layer and electrically connected to the second circuit wiring structure, the second semiconductor chip being disposed on the first semiconductor chip such that the second rear surface faces the first front surface;
- an encapsulation layer covering at least a portion of each of a side surface of the first semiconductor chip and the second rear surface of the second semiconductor chip;
- a third through via for power penetrating through the encapsulation layer and electrically connected to the second through via for power; and
- a plurality of connection bumps disposed on a lower surface of the encapsulation layer,
- wherein the first through via for power is electrically connected to a corresponding one of the plurality of connection bumps and the third through via for power is connected to a corresponding one of the plurality of connection bumps, and
- wherein a width of the first semiconductor chip is narrower than a width of the second semiconductor chip.

11. The semiconductor package of claim 10,
- wherein the second semiconductor chip receives power through the second through via for power and the third through via for power.

12. The semiconductor package of claim 10,
- wherein at least one of the plurality of connection bumps is disposed below the first rear surface of the first semiconductor chip, and
- wherein at least one of the plurality of connection bumps is disposed below the second rear surface of the second semiconductor chip.

13. The semiconductor package of claim 10,
- wherein a ratio of a planar area of the first semiconductor chip to a planar area of the second semiconductor chip has a value from 1:2 to 1:5.

14. The semiconductor package of claim 10,
- wherein the second semiconductor chip further comprises:
- a second through via for a signal penetrating through the second substrate layer and electrically connected to the second circuit wiring structure; and
- a third through via for a signal penetrating through the encapsulation layer and spaced apart from the third through via for the signal, wherein the second through via for the signal is electrically connected to the third through via for the signal or the first circuit wiring structure.

15. The semiconductor package of claim 10, further comprising:
a third semiconductor chip on the second rear surface of the second semiconductor chip,
wherein the first semiconductor chip and the third semiconductor chip are spaced apart from each other.

16. The semiconductor package of claim 10, further comprising:
a dummy semiconductor chip disposed on the second front surface of the second semiconductor chip.

17. A semiconductor package, comprising:
a first semiconductor chip having a first front surface and a first rear surface, opposite to the first front surface, and including:
  a first substrate layer disposed between the first front surface and the first rear surface,
  a first circuit layer including a first circuit structure and providing the first front surface and disposed on the first substrate layer, and
  a first through via for power penetrating through the first substrate layer and electrically connected to the first circuit structure;
a second semiconductor chip having a second front surface and a second rear surface, opposite to the second front surface, and including:
  a second substrate layer disposed between the second front surface and the second rear surface,
  a second circuit layer including a second circuit structure and providing the second front surface and disposed on the second substrate layer, and
  a second through via for power penetrating through the second substrate layer and electrically connected to the second circuit structure,
the second semiconductor chip being disposed on the first semiconductor chip such that the second front surface faces the first front surface;
an encapsulation layer covering at least a portion of each of a side surface of the first semiconductor chip and a side surface of the second semiconductor chip;
a third through via for power penetrating through the encapsulation layer and adjacent to the side surface of the first semiconductor chip and the side surface of the second semiconductor chip; and
an upper redistribution structure disposed on the encapsulation layer to electrically connect the third through via for power and the second through via for power with each other,
wherein the first semiconductor chip receives power through the first through via for power, and
wherein the second semiconductor chip receives power through the third through via for power, the upper redistribution structure, and the second through via for power.

18. The semiconductor package of claim 17,
wherein a width of the third through via for power is greater than each of a width of the first through via for power and a width of the second through via for power.

19. The semiconductor package of claim 17,
wherein a ratio of a planar area of the first semiconductor chip to a planar area of the second semiconductor chip has a value from 2:1 to 1:2.

20. The semiconductor package of claim 17,
wherein at least one of the first semiconductor chip and the second semiconductor chip is provided as a plurality of semiconductor chips spaced apart from each other.

* * * * *